(12) United States Patent
Yoon et al.

(10) Patent No.: US 9,780,033 B2
(45) Date of Patent: Oct. 3, 2017

(54) SEMICONDUCTOR DEVICE AND METHOD OF MANUFACTURING THE SAME

(71) Applicant: SAMSUNG ELECTRONICS CO., LTD., Suwon-si, Gyeonggi-do (KR)

(72) Inventors: Changseop Yoon, Yangsan-si (KR); Kwangsub Yoon, Yongin-si (KR); Jongmil Youn, Yongin-si (KR); Hyung Jong Lee, Osan-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/053,182

(22) Filed: Feb. 25, 2016

(65) Prior Publication Data
US 2016/0293545 A1 Oct. 6, 2016

(30) Foreign Application Priority Data

Apr. 1, 2015 (KR) .................. 10-2015-0046274

(51) Int. Cl.
| | |
|---|---|
| H01L 23/528 | (2006.01) |
| H01L 21/8238 | (2006.01) |
| H01L 29/06 | (2006.01) |
| H01L 27/02 | (2006.01) |
| H01L 23/485 | (2006.01) |

(52) U.S. Cl.
CPC .. H01L 23/5283 (2013.01); H01L 21/823871 (2013.01); H01L 23/485 (2013.01); H01L 27/0207 (2013.01); H01L 29/0653 (2013.01)

(58) Field of Classification Search
CPC ......... H01L 2924/0002; H01L 2924/00; H01L 29/785; H01L 29/66795; H01L 29/66545; H01L 21/76897; H01L 21/823821
USPC .......................... 257/288, 401, 369; 438/283
See application file for complete search history.

(56) References Cited

U.S. PATENT DOCUMENTS

| | | | |
|---|---|---|---|
| 6,426,263 B1 | 7/2002 | Chittipeddi | |
| 7,439,153 B2 | 10/2008 | Tsuboi et al. | |
| 8,183,114 B2* | 5/2012 | Tsuboi | H01L 27/11 |
| | | | 438/250 |
| 8,647,938 B1 | 2/2014 | Baars et al. | |
| 8,766,256 B2 | 7/2014 | Chen et al. | |

(Continued)

FOREIGN PATENT DOCUMENTS

| | | |
|---|---|---|
| JP | 2005-050998 A | 2/2005 |
| JP | 2012-004484 A | 1/2012 |

(Continued)

*Primary Examiner* — Jonathan Han
(74) *Attorney, Agent, or Firm* — Lee & Morse P.C.

(57) ABSTRACT

A semiconductor device includes a substrate including PMOSFET and NMOSFET regions, a first gate structure extending in a first direction and crossing the PMOSFET and NMOSFET regions, and a gate contact on and connected to the first gate structure, the gate contact being between the PMOSFET and NMOSFET regions, the gate contact including a first sub contact in contact with a top surface of the first gate structure, the first sub contact including a vertical extending portion extending vertically toward the substrate along one sidewall of the first gate structure, and a second sub contact spaced apart from the first gate structure, a top surface of the second sub contact being positioned at a same level as a top surface of the first sub contact.

25 Claims, 21 Drawing Sheets

(56) References Cited

U.S. PATENT DOCUMENTS

| | | | |
|---|---|---|---|
| 8,791,509 B2 | 7/2014 | Beyer et al. | |
| 8,865,482 B2 | 10/2014 | Wang et al. | |
| 9,105,691 B2 | 8/2015 | Cheng et al. | |
| 2007/0099414 A1* | 5/2007 | Frohberg | H01L 21/76877 |
| | | | 438/618 |
| 2014/0203352 A1 | 7/2014 | Chuang et al. | |
| 2014/0252496 A1 | 9/2014 | Liu et al. | |
| 2016/0005851 A1* | 1/2016 | Song | H01L 23/535 |
| | | | 257/401 |

FOREIGN PATENT DOCUMENTS

| | | |
|---|---|---|
| KR | 10-1998-0058425 A | 10/1998 |
| KR | 10-2002-0002996 A | 1/2002 |
| KR | 10-2002-0010985 A | 2/2002 |
| KR | 10-2010-0073351 A | 7/2010 |
| KR | 10-2011-0078105 A | 7/2011 |

* cited by examiner

2000

3000

SEMICONDUCTOR DEVICE AND METHOD OF MANUFACTURING THE SAME

CROSS-REFERENCE TO RELATED APPLICATION

Korean Patent Application No. 10-2015-0046274, filed on Apr. 1, 2015, in the Korean Intellectual Property Office, and entitled: "Semiconductor Device and Method of Manufacturing the Same," is incorporated by reference herein in its entirety.

BACKGROUND

1. Field

Example embodiments are related to a semiconductor device and a method of manufacturing the same, and more particularly, to a semiconductor device including a field effect transistor and a method of manufacturing the same.

2. Description of the Related Art

Due to their small-sized, multifunctional, and/or low-cost characteristics, semiconductor devices are being spotlighted as important elements in the electronic industry. The semiconductor devices may be classified into memory devices for storing logic data, logic devices for processing the logic data, and hybrid devices including both memory and logic elements. To meet the increased demand for electronic devices with fast speed and/or low power consumption, it is necessary to realize semiconductor devices with high reliability, high performance, and/or multiple functions. To satisfy these technical requirements, complexity and/or integration density of semiconductor devices are being increased.

SUMMARY

Example embodiments provide a semiconductor device including field effect transistors with more improved electrical characteristics.

Other example embodiments provide a method of manufacturing a semiconductor device including field effect transistors with more improved electrical characteristics.

According to example embodiments, a semiconductor device may include a substrate including PMOSFET and NMOSFET regions, a first gate structure extending in a first direction and crossing the PMOSFET and NMOSFET regions, and a gate contact on and connected to the first gate structure, the gate contact being between the PMOSFET and NMOSFET regions, the gate contact including a first sub contact in contact with a top surface of the first gate structure, the first sub contact including a vertical extending portion extending vertically toward the substrate along one sidewall of the first gate structure, and a second sub contact spaced apart from the first gate structure, a top surface of the second sub contact being positioned at a same level as a top surface of the first sub contact.

In example embodiments, the semiconductor device may further include a device isolation layer disposed between the PMOSFET and NMOSFET regions. The gate contact may be provided on the first gate structure crossing the device isolation layer.

In example embodiments, a bottom surface of the vertical extending portion may be in contact with a top surface of the first device isolation layer.

In example embodiments, the substrate may include active patterns extending in a second direction perpendicular to the first direction on the PMOSFET and NMOSFET regions. The first gate structure may cross the active patterns.

In example embodiments, the semiconductor may further include a second device isolation layer defining the active patterns in the substrate. Upper portions of the active patterns may protrude from the second device isolation layer.

In example embodiments, the semiconductor device may further include a via provided on the gate contact and a conductive line provided on the via to be electrically connected to the first gate structure through the via and the gate contact.

In example embodiments, the first and second sub contacts may have the same material and are connected to each other to constitute a single body.

In example embodiments, when viewed in a plan view, the vertical extending portion may be overlapped with the second sub contact.

In example embodiments, the semiconductor device may further include a second gate structure being immediately adjacent to the first gate structure. When viewed in a plan view, the second sub contact may be provided between the first and second gate structures.

In example embodiments, the semiconductor device may further include a capping layer covering top surfaces of the first and second gate structures. A bottom surface of the vertical extending portion may be positioned at lower level than that of the capping layer.

In example embodiments, the semiconductor device may further include source/drain regions provided at both sides of the first gate structure, conductive connection patterns provided at both sides of the first gate structure and connected to the source/drain regions, and source/drain contacts disposed on the conductive connection patterns and electrically connected the source/drain regions through the conductive connection patterns. A bottom surface of the second sub contact may be positioned at the same level as that of the source/drain contact.

In example embodiments, when viewed in a cross-sectional view in the second direction perpendicular to the first direction, the second sub contact may protrude from one sidewall of the first sub contact.

In example embodiments, one sidewall of the gate contact may have a stepped profile at a boundary at which the first and second sub contacts are in contact with each other.

In example embodiments, the first sub contact may have a first sidewall, and the second sub contact may have a second sidewall adjacent to the first sidewall. The first sidewall of the first sub contact and the second sidewall of the sub contact may be coplanar with each other.

In example embodiments, when viewed in a plan view, the first sub contact may be extended in the second direction perpendicular to the first direction to penetrate the second sub contact.

In example embodiments, the vertical extending portion of the first sub contact may include a void formed therein.

In example embodiments, the semiconductor device may further include a barrier layer surrounding a sidewall and a bottom surface of the gate contact. A portion of the barrier layer may be interposed between the first sub contact and the first gate structure.

According to other example embodiments, a semiconductor device may include a substrate including PMOSFET and NMOSFET regions, a device isolation layer between the PMOSFET and NMOSFET regions, first and second gate electrodes crossing the device isolation layer and extending from the PMOSFET region to the NMOSFET region, a gate contact provided on and connected to the first gate electrode on the device isolation layer, a via on the gate contact and a conductive line provided on the via and electrically connected to the first gate electrode through the via and the gate contact. The gate contact may include a first sub contact being in contact with the first gate electrode and, when viewed in a plan view, a second sub contact may be provided between the first and second gate electrodes.

In example embodiments, the substrate may include active patterns formed on a respective one of the PMOSFET and NMOSFET regions. The first and second gate electrodes may be extended parallel to each other and cross the active patterns.

In example embodiments, the first sub contact may include a vertical extending portion that vertically extends toward the substrate and adjacent to one sidewall of the first gate electrode. When viewed in a plan view, the vertical extending portion may be overlapped with the second sub contact.

According to still other example embodiments, a semiconductor device includes a substrate including PMOSFET and NMOSFET regions, a first gate structure extending in a first direction and crossing the PMOSFET and NMOSFET regions, and a gate contact on and connected to the first gate structure, the gate contact being between the PMOSFET and NMOSFET regions, wherein the gate contact includes a first sub contact in contact with a top surface of the first gate structure, the first sub contact including a vertical extending portion extending vertically toward the substrate along one sidewall of the first gate structure, and a second sub contact extending laterally from the first sub contact to have a non-overlapping relationship with the gate structure, a top surface of the second sub contact being level with a top surface of the first sub contact.

Longitudinal directions of the first and second sub contacts may be perpendicular to each other, the first and second sub contacts defining a single and seamless structure.

The vertical extending portion may overlap the second sub contact, the vertical extending portion extending from the second sub contact toward the substrate.

The semiconductor device may further include source/drain regions at two sides of the first gate structure, top surfaces of the source/drain regions being level with the top surfaces of the first and second sub contacts.

A thickness of the second sub contact may equal that of the source/drain regions.

According to yet other example embodiments, a method of fabricating a semiconductor device includes defining PMOSFET and NMOSFET regions in a substrate, forming first and second gate structures, the first and second gate structures extending parallel to each other and crossing the PMOSFET and NMOSFET regions, forming a interlayer insulating layer to cover the first and second gate structures, patterning the interlayer insulating layer to form a first sub contact hole, wherein, when viewed in a plan view, the first sub contact hole is positioned between the PMOSFET and NMOSFET regions, and the first and second gate structures, patterning the interlayer insulating layer to form a second sub contact hole exposing a top surface of the first gate structure, the first and second sub contact holes connected to each other to form a single connecting hole, and forming a gate contact filling the connecting hole, wherein the second sub contact hole includes a vertical extending hole that vertically extends toward the substrate and exposes one sidewall of the first gate structure, and wherein, when viewed in a plan view, the vertical extending portion overlaps the first sub contact.

The method may further include forming source/drain regions in portions of the PMOSFET and NMOSFET regions positioned at both sides of each of the plurality of gate electrodes, forming conductive connection patterns at both sides of the first gate structure to be connected to the source/drain regions, and patterning the interlayer insulating layer to form a source/drain contact hole exposing at least one of top surfaces of the conductive connection patterns, wherein the source/drain contact hole is concurrently formed with the first sub contact hole.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
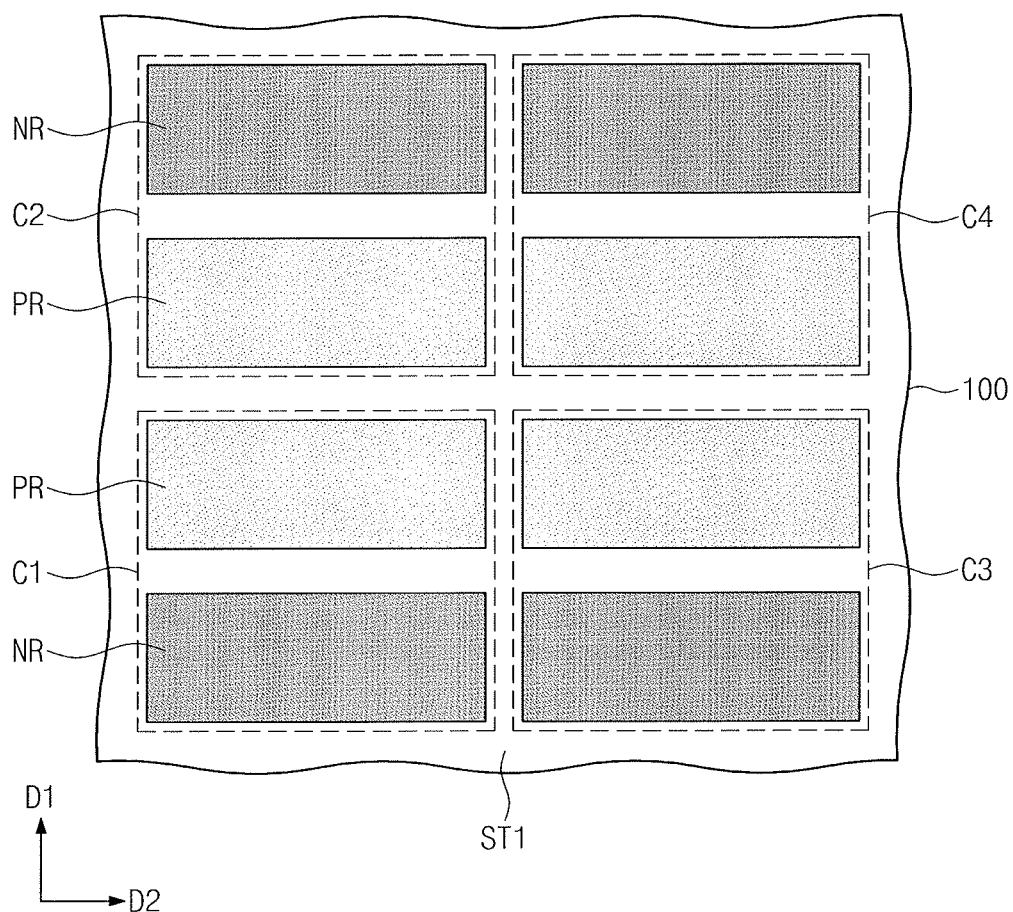
FIG. 1 illustrates a plan view of a semiconductor device according to example embodiments.

Example embodiment's s will now be described more fully hereinafter with reference to the accompanying drawings, in which example embodiments are shown. Example embodiments may, however, be embodied in many different forms and should not be construed as being limited to those set forth herein; rather, these embodiments are provided so that this disclosure will be thorough and complete, and will fully convey the concept of exemplary implementations to those of skill in the art. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. Other words used to describe the relationship between elements or layers should be interpreted in a like fashion (e.g., "between" versus "directly between," "adjacent" versus "directly adjacent,"

"on" versus "directly on"). As used herein the term "and/or" includes any and all combinations of one or more of the associated listed items.

It will be further understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view illustrating a semiconductor device according to example embodiments.

Referring to FIG. 1, a semiconductor device according to example embodiments may include a plurality logic cells, e.g., first through fourth logic cells C1, C2, C3, and C4, provided on a substrate 100. Each of the logic cells C1, C2, C3 and C4 may include a plurality of transistors. As an example, the semiconductor device may include a first logic cell C1, a second logic cell C2 spaced apart from the first logic cell C1 in a first direction D1, a third logic cell C3 spaced apart from the first logic cell C1 in a second direction D2 perpendicular to the first direction D1, and a fourth logic cell C4 spaced apart from the second logic cell C2 in the second direction D2. The first and second directions D1 and D2 may be parallel to a top surface of the substrate 100. Each of the logic cells C1, C2, C3 and C4 may include active regions separated from each other by a first device isolation layer ST1. Each of the logic cells C1, C2, C3 and C4 may include a PMOSFET region PR and a NMOSFET region NR separated from each other by the first device isolation layer ST1.

As an example, the PMOSFET region PR and the NMOSFET region NR may be spaced apart from each other in the first direction D1. The PMOSFET region PR of the first logic C1 may be adjacent to the PMOSFET region PR of the second logic cell C2 in the first direction D1. In the description below, a logic cell may be referred to as a unit configured to perform a logical operation. The number of logic cells may be variously changed from that illustrated in the drawings.

Figure 2:
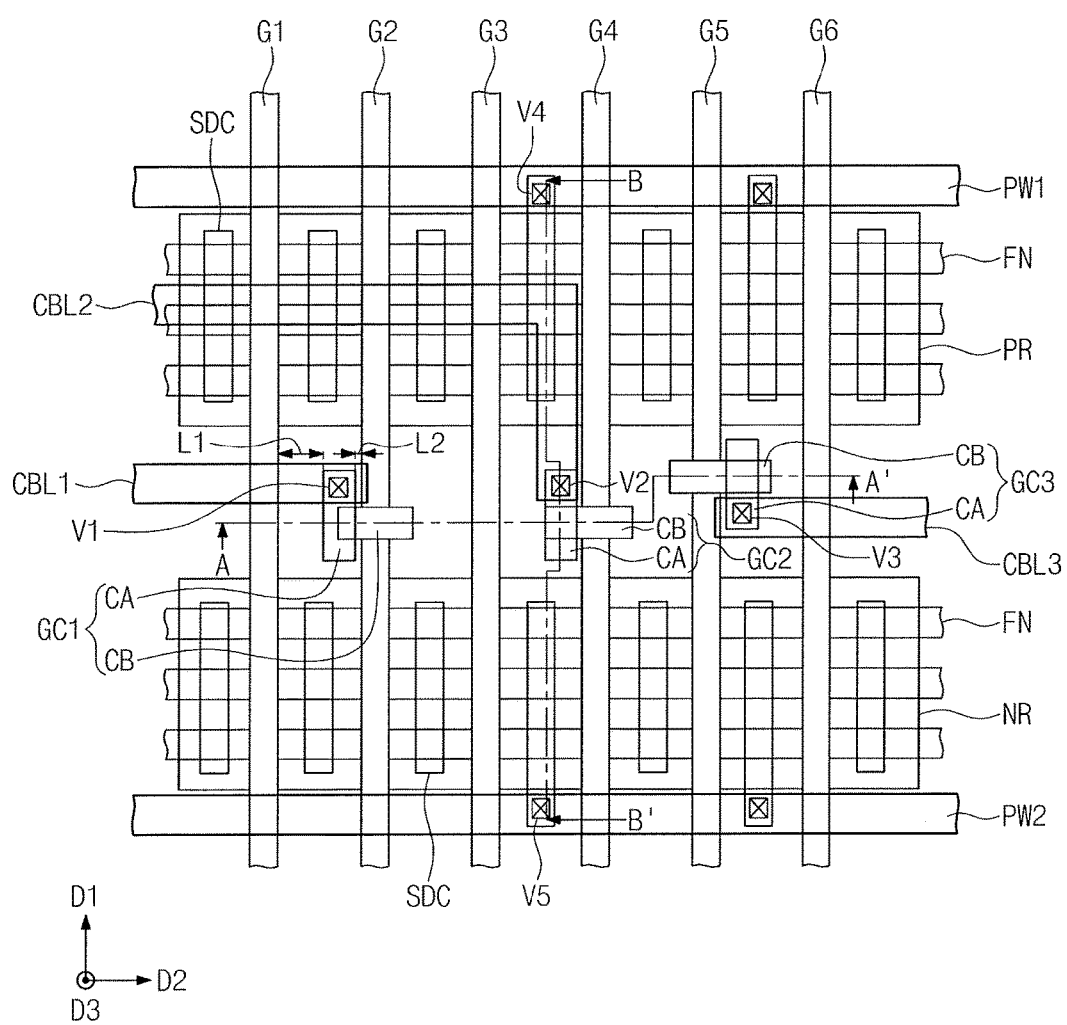
FIG. 2 illustrates a plan view of a semiconductor device according to example embodiments.
Figure 3A:
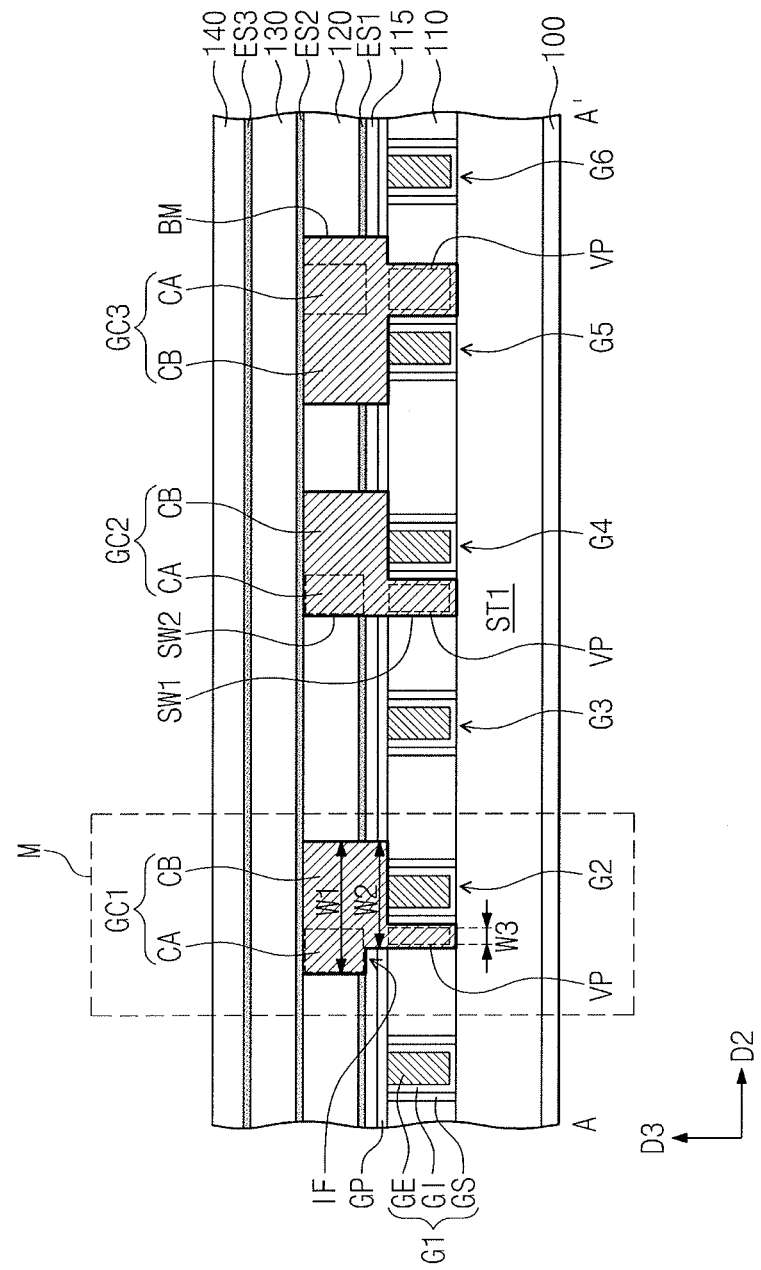
FIGS. 3A and 3B illustrate cross-sectional views along lines A-A' and B-B' of FIG. 2, respectively.
Figure 3B:
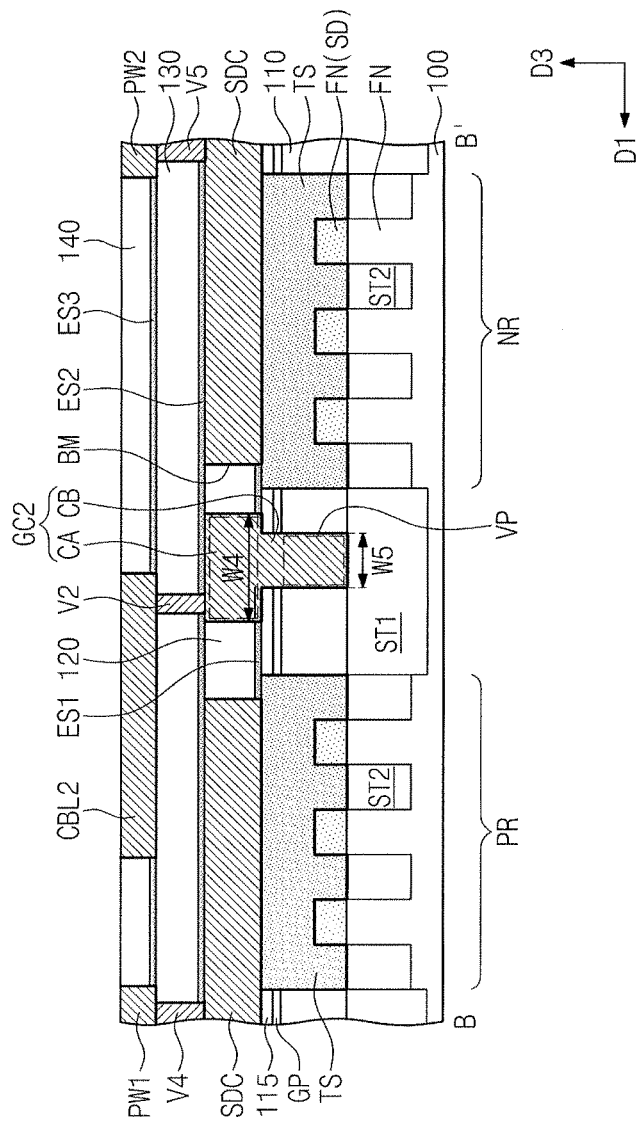
Figure 3C:
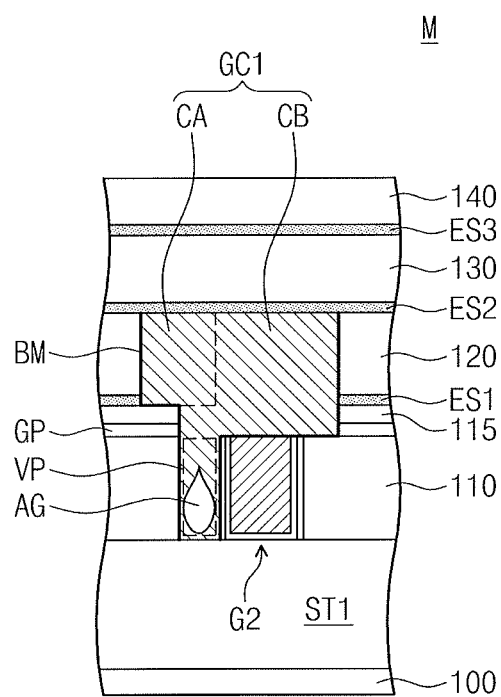
FIGS. 3C, 3D, and 3E illustrate cross-sectional views of other examples of region "M" in FIG. 3A.
Figure 3D:
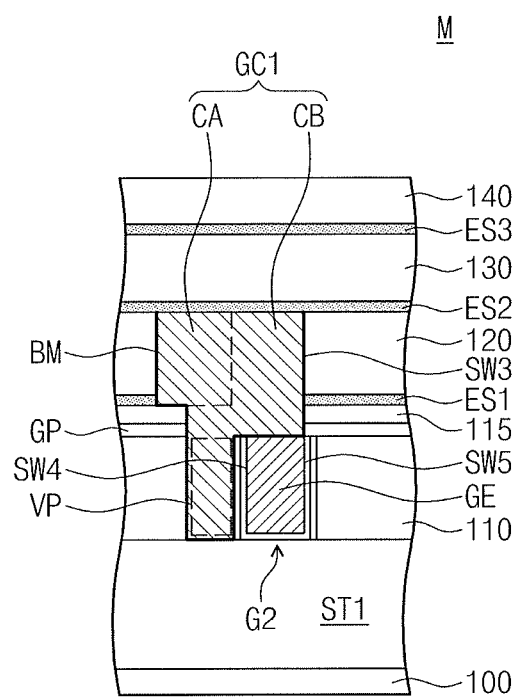
Figure 3E:
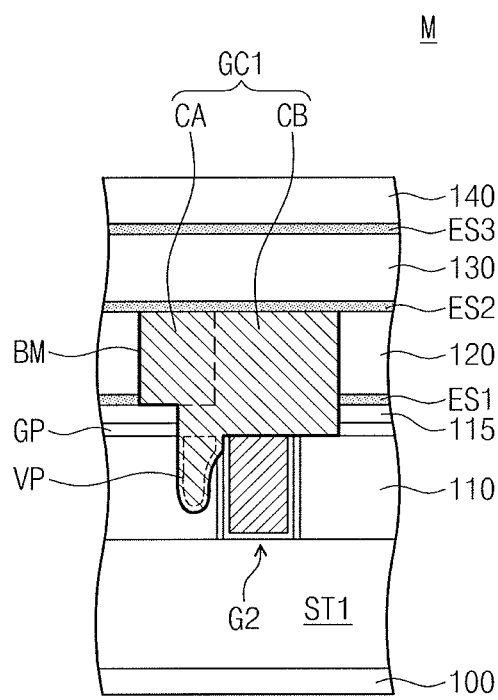

FIG. 2 is an enlarged plan view of a portion, e.g., the first logic cell C1, of the semiconductor device in FIG. 1. FIGS. 3A and 3B are cross-sectional views along lines A-A' and B-B' of FIG. 2. FIGS. 3C, 3D, and 3E are cross-sectional views illustrating other examples of region "M" of FIG. 3A. Hereinafter, example embodiments will be described with reference to the first logic cell C1 of FIG. 1, but other logic cells may be substantially the same as or similar to the first logic cell C1.

Referring to FIGS. 2, 3A, and 3B, the first device isolation layer ST1 may be provided on the substrate 100 to define the PMOSFET and NMOSFET regions PR and NR. Furthermore, the first logic cell C1 may be separated from the adjacent logic cells C2, C3, and C4 by the first device isolation layer ST1. The first device isolation layer ST1 may be formed in an upper portion of the substrate 100. As an example, the substrate 100 may be silicon or germanium substrate or SOI (Silicon On Insulator) substrate.

The PMOSFET and the NMOSFET regions PR and NR may be spaced apart from each other in the first direction D1 parallel to a top surface of the substrate 100 with the first device isolation layer ST1 interposed therebetween (FIG. 3B). In an example embodiment, although each of the PMOSFET and the NMOSFET regions PR and NR may be shown as a single continuous region in drawings, it may be formed to include a plurality of regions which are separated from each other by the first device isolation layer ST1.

A plurality of active patterns FN extending in the second direction D2 perpendicular to the first direction D1 may be provided on the PMOSFET and the NMOSFET regions PR and NR. The active patterns FN may be arranged, e.g., spaced apart from each other, along the first direction D1. Second device isolation layers ST2 may be disposed at both sides of each of the active patterns FN to extend in the second direction D2 (FIG. 3B). In an example embodiment, each of the active patterns FN may include a fin-shaped portion. As an example, the fin-shaped portion may be positioned between the second device isolation layers ST2 and may upwardly protrude relative to a top surface of the second device isolation layers ST2.

Although the number of the active patterns FN provided respectively on the PMOSFET and the NMOSFET regions PR and NR in FIG. 2 is three, example embodiments are not limited thereto. The first and second device isolation layers ST1 and ST2 may be connected to each other to form a single continuous insulating layer. For example, a thickness of the first device isolation layer ST1 may be thicker than that of the second device isolation layer ST2, e.g., along a third direction D3. For example, the second device isolation layer ST2 and the first device isolation layer ST1 may be formed by a separate process. In another example, the first and second device isolation layers ST1 and ST2 may be formed at the same time and may have substantially the same thickness. The first and second device isolation layers ST1 and ST2 may be formed in the upper portion of the substrate 100. As an example, the first and second device isolation layers ST1 and ST2 may include a silicon oxide layer.

As illustrated in FIG. 2, gate structures G1-G6 may be provided to cross the active patterns FN and extend in the direction D1. The gate structures G1-G6 may be spaced apart from each other in the second direction D2. Each of the gate structures G1-G6 may cross the PMOSFET region PR, the first device isolation layer ST1, and the NMOSFET region NR.

As illustrated in FIG. 3A, each of the gate structures G1-G6 may include a gate electrode GE, a gate insulating pattern GI provided under the gate electrode GE, and gate spacers GS provided on opposite sidewalls of the gate electrode GE. A first interlayer insulating layer 110 may be provided to fill between the gate structures G1-G6. A capping layer GP may cover the first interlayer insulating layer 110 and top surfaces of the gate electrodes GE. As an example, the capping layer GP may be partially removed on each of a second, fourth, and fifth gate structures G2, G4, and G5. Furthermore, some of gate spacers GS of each of the second, fourth, and fifth gate structures G2, G4, and G5 may be thinner than gate spacers GS of other gate structures G1, G3, and G6. Second to fifth interlayer insulating layers 115, 120, 130 and 140 may be sequentially stacked on the capping layer GP. A first etch stop layer ES1 may be interposed between the second and third interlayer insulating layers 115 and 120. A second etch stop layer ES2 may be interposed between the third and fourth interlayer insulating layers 120 and 130. A third etch stop layer ES3 may be interposed between the fourth and fifth interlayer insulating layers 130 and 140.

The gate electrode GE may include at least one of doped semiconductors, metals, or conductive metal nitrides. The gate insulating pattern GI may include at least one of a silicon layer, a silicon oxynitride layer or a high-k dielectric layer whose dielectric constant is higher than that of the silicon oxide layer. Each of the capping layer GP and the gate spacers GS may include at least one of a silicon oxide layer, a silicon nitride layer or a silicon oxynitride layer. Each of the first to fifth interlayer insulating layers 110, 115, 120, 130, and 140 may include a silicon oxide layer or a silicon oxynitride layer. Each of the first to third etch stop layers ES1, ES2, and ES3 may include a silicon carbide nitride layer or a silicon nitride layer.

Source/drain regions SD may be provided in portions of the active patterns FN positioned at both sides of each of the gate structures G1-G6. As shown in the FIG. 3B, the source/drain regions SD may be locally formed in the active patterns FN. However, embodiments are not limited thereto, e.g., the source/drain regions SD may be extended into an upper portion of substrate 100 between the second device isolation layers ST2. The source/drain regions SD in the PMOSFET region PR may be p-type impurity regions, and the source/drain regions SD in the NMOSFET region NR may be n-type impurity regions. The fin-shaped portions may be positioned under each of the gate structures G1-G6 and may be overlapped with each of the gate structures G1-G6. A portion of the fin-shaped portion may serve as a channel region. For example, the channel region may correspond to a region of the fin-shaped portion, which is overlapped with the gate structure.

In example embodiments, conductive connection patterns TS may be provided at both sides of each of the gate structures G1-G6. In the PMOSFET region PR, the source/drain regions SD, which are spaced apart from each other in the first direction D1 by the second device isolation layers ST2 interposed therebetween, may be electrically connected to each other through the conductive connection patterns TS. That is, the conductive connection patterns TS may be provided to cover the active patterns FN thereunder and connect the source/drain regions SD, which are spaced apart from each other in the first direction D1, to each other. The conductive connection patterns TS may directly contact with the source/drain regions SD. The conductive connection pattern TS may be formed of or include at least one of metal silicide materials. As an example, the conductive connection pattern TS may include at least one of titanium silicide, tantalum silicide or tungsten silicide. The conductive connection patterns TS may further include a metal layer. As an example, the metal layer may include at least one of titanium, tantalum or tungsten. As an example, the conductive connection patterns TS may include a metal silicide layer and a metal layer on the metal silicide layer.

In the NMOSFET regions NR, the source/drain regions SD may also be connected to each other through the conductive connection patterns TS in a similar manner. That is, the source/drain regions SD, which are spaced apart from each other in the first direction D1 by the second device isolation layer ST2 interposed therebetween, may be connected to each other through the conductive connection pattern TS. The conductive connection patterns TS may be provided in the first and second interlayer insulating layers 110 and 115.

Source/drain contacts SDC may be provided on the conductive connection patterns TS. As an example, when viewed in a plan view, the source/drain contacts SDC may be provided at both sides of each of the gate structures G1-G6. Each of the source/drain contacts SDC may be shaped like a bar which extends in the first direction D1 and may cover a top surface of the conductive connection pattern TS. Although not shown in the drawings, some of the source/drain contacts SDC may be extended over the first device isolation layer ST1 to connect the source/drain regions SD of the PMOSFET region PR to the source/drain regions SD of the NMOSFET region NR. Barrier layers BM may surround sidewalls and bottom surfaces of the source/drain contacts SDC.

The source/drain contacts SDC may include, e.g., at least one of doped semiconductors, metals, or conductive metal nitrides. The conductive connection patterns TS may include a different material from the source/drain contacts SDC.

The first logic cell C1 may include a first wiring line PW1 provided outside the PMOSFET region PR and a second wiring line PW2 provided outside the NMOSFET region NR. As an example, the first wiring line PW1 on the PMOSFET region PR may serve as a pathway for delivering a drain voltage (Vdd) or a power voltage. As an example, the second wiring line PW2 on the NMOSFET region NR may serve as a pathway for delivering a source voltage (Vss) or a ground voltage.

The first and second wiring lines PW1 and PW2 may extend in the second direction D2 and may be shared by the logic cells adjacent to each other in the second direction D2 (FIGS. 1-2). As an example, the first wiring line PW1 may be shared by the first and third logic cells C1 and C3. Furthermore, the first wiring line PW1 may be shared by the PMOSFET region PR of the first logic cell C1 and the PMOSFET region PR of the second logic cell C2.

In some example embodiments, a fourth via V4 may be provided to be in contact with the source/drain contact SDC between the third and the fourth gate structures G3 and G4 in PMOSFET region PR. Accordingly, the source/drain region SD between the third and the fourth gate structures G3 and G4 may be electrically connected to the first wiring line PW1 through the conductive connection pattern TS, the source/drain contact SDC, and the fourth via V4. Similarly, the source/drain region SD in the NMOSFET region NR may be electrically connected to the second wiring line PW2 through a fifth via V5.

According to the example embodiments, first to third gate contacts GC1-GC3 may be provided on the second, fourth, and fifth gate structures G2, G4 and G5, respectively. Barrier layers BM may be provided to surround sidewalls and bottom surfaces of the first to third gate contacts GC1-GC3, e.g., solid black line in FIG. 3A surrounding bottom and sides of the first to third gate contacts GC1-GC3. Top surfaces of the first to third gate contacts GC1-GC3 may not be covered with the barrier layers BM. Some of the barrier layers BM may be interposed between the first to third gate contacts GC1-GC3 and the second, fourth, and fifth gate structures G2, G4, and G5. The barrier layers may include titanium/titanium nitride (Ti/TiN). Accordingly, the barrier layers BM may prevent metal diffusion between the first to third gate contacts GC1-GC3 and the second, fourth, and fifth gate structures G2, G4 and G5.

In the description below, the first gate contact GC1 will be described in detail. The first gate contact GC1 may include first and second sub contacts CB and CA. The first sub contact CB may be in, e.g., direct, contact with a top surface of the gate electrode GE of the second gate structure G2, e.g., the first sub contact CB may be in contact with the top surface of the gate electrode GE through a barrier layer BM to be described later. The second sub contact CA may be spaced apart from the gate electrode GE.

The first and second sub contacts CB and CA may include substantially the same material and may be directly connected to each other to constitute the first gate contact GC1 provided as a single, e.g., and seamless, body. The first and second sub contacts CB and CA may include, e.g., at least one of doped semiconductors, metals, or conductive metal nitrides. As an example, the first and second sub contacts CB and CA may include the same material as the source/drain contacts SDC.

The second sub contact CA may be provided in the third interlayer insulating layer 120. Accordingly, as illustrated in FIG. 3A, at least top surfaces of the second sub contact CA may be substantially coplanar with those of the third interlayer insulating layer 120, e.g., bottom surfaces of the second sub contact CA may be substantially coplanar with those of the first etch stop layer ES1. Further, the top and bottom surfaces of the second sub contact CA may be substantially positioned at the same level as those of the source/drain contacts SDC, respectively.

When viewed in a plan view, the second sub contact CA may be disposed between the first and second gate structures G1 and G2. The second sub contact CA may be positioned closer to one (e.g., G2) of both gate structures (e.g., G1 and G2). For example, as illustrated in FIG. 2, a distance between the first gate structure GI and the second sub contact CA may be a first distance L1, and a distance between the second gate structure G2 and the second sub contact CA may be a second distance L2. The second distance L2 may be smaller than the first distance L1. In another example, the second sub contact CA may be positioned closer to the first gate structure G1 than the second gate structure G2, but it is not limited thereto. The second sub contact CA may be shaped like a bar extending in the first direction D1.

As illustrated in FIG. 3A, the first sub contact CB may include a vertical extending portion VP that vertically extends toward the substrate 100 along one sidewall of the second gate structure G2. For example, a bottom surface of the vertical extending portion VP may be in contact, e.g., via the barrier layer BM, with a top surface of the first device isolation layer ST1. In another example, the bottom surface of the vertical extending portion VP may be positioned at a higher level than the top surface of the first device isolation layer ST1, but it is not limited thereto. The vertical extending portion VP may be a portion formed by double etching processes when the first and second sub contacts CB and CA are formed, which will be described later. Accordingly, when viewed in a plan view, the vertical extending portion VP may be overlapped with the second sub contact CA.

In other embodiments, the vertical extending portion VP may be in direct contact with the gate electrode GE by removing the gate spacer GS between the vertical extending portion VP and the gate electrode GE. Accordingly, a contact resistance may be reduced by broadening a contact area between the first gate contact GC1 and the gate electrode GE.

In yet other embodiments, referring to FIG. 3C, the first sub contact CB may further include a void AG formed in the vertical extending portion VP. The void AG may be created by not fully depositing conductive materials due to a very small width W3 when the vertical extending portion VP is formed in the first sub contact CB.

In still other embodiments, referring to FIG. 3D, the first sub contact CB may have a sidewall substantially planar with a sidewall of the gate electrode GE. That is, a third sidewall SW3 of the first sub contact CB, i.e., a sidewall opposite the second sub contact CA, may be substantially planar with a fifth sidewall SW5 of the gate electrode GE that is opposite a fourth sidewall SW4 of the gate electrode adjacent to the vertical extending portion VP. In this case, the third sidewall SW3 may not be further projected beyond the fifth sidewall SW5. That is, as shown in the drawings, the third sidewall SW3 and the fifth sidewall SW5 may be aligned with each other. Alternatively, the third sidewall SW3 may be disposed above a region between the fourth sidewall SW4 and the fifth sidewall SW5.

In still other embodiments, referring to FIG. 3E, a bottom surface of the vertical extending portion VP may be spaced apart from a top surface of the first device isolation layer ST1. That is, the bottom surface of the vertical extending portion VP may be positioned at a higher level than the top surface of the first device isolation layer ST1 relative to the substrate 100. A first interlayer insulating layer 110 and a gate spacer GS may be interposed between the vertical extending portion VP and the gate electrode GE.

Referring back to FIG. 3A, one sidewall of the first gate contact GC1 may have a stepped profile at a boundary IF at which the first and second sub contacts CB and CA are in contact with each other. That is, when viewed in a cross-sectional view in the second direction D2, the second sub contact CA may protrude from one sidewall of the first sub contact CB. This is because the second sub contact CA may be arranged to be offset in a direction opposite to the second direction D2 relative to the first sub contact CB.

Referring back to FIG. 3A, when viewed in a cross-sectional view in the second direction D2, upper, intermediate, and lower portions of the first gate contact GC1 may have first, second, and third widths W1, W2 and W3, respectively. The intermediate portion of the first gate contact GC1 may be positioned between a bottom surface of the second sub contact CA and a top surface of the gate electrode GE. The lower portion of the first gate contact GC1 may be the vertical extending portion VP. The second width W2 may be smaller than the first width W1, and the third width W3 may be smaller than the second width W2. When viewed in a cross-sectional view in the second direction D2, the width of the first gate contact GC1 may be reduced gradually from the upper portion to the lower portion.

Referring to FIG. 2, a first conductive line CBL1 may be disposed on the first gate contact GC1. A first via V1 may be disposed between the first gate contact GC1 and the first conductive line CBL1. The first via V1 may be provided on the first gate contact GC1. The first conductive line CBL1 may be electrically connected to the gate electrode GE through the first via V1 and the first gate contact GC1 to apply a signal to the gate electrode GE. A connection structure between the first conductive line CBL1, the first via V1, and the first gate contact GC1 may be similar to that between a second conductive line CRL2, a second via V2, and a second gate contact GC2 in FIG. 3B, when viewed in a cross-sectional view in the first direction D1.

In detail, the fourth and fifth interlayer insulating layers 130 and 140 may be sequentially stacked on the third interlayer insulating layer 120 (FIG. 3A). The first via V1 may be provided in the fourth interlayer insulating layer 130, and the first conductive line CBL1 may be provided in the fifth interlayer insulating layer 140, e.g., in a similar manner to a second via V2 and a second conductive line CBL2 in FIG. 3B. The second sub contact CA may be formed at the same level as the source/drain contacts SDC, and the first gate contact GC1 may be extended to the first device isolation layer ST1 from the first sub contact CB, e.g., via the vertical extending portion VP. When viewed in a plan view, the first via V1 may be stably formed on the extended first gate contact GC1, e.g., the first via V1 may be formed on the second sub contact CA above the vertical extending portion VP. Accordingly, reliability of the semiconductor device may be improved by preventing the misalignment and securing the process margin when forming the first via V1 on the first gate contact GC1. That is, the second sub contact CA may serve as a pad to dispose the first via V1. Further, the first gate contact GC1 and the first via V1 may have a large contact area therebetween due to the large planar area of the first gate contact GC1. Accordingly, a semiconductor device having a low resistance may be implemented.

The afore-described structure of the first gate contact GC1 may be an example of various structures of the first gate contact GC1, which can be realized based on the example embodiments. In the description below, the second gate contact GC2 corresponding to another example will be described in detail.

Referring to FIGS. 3A-3B, the second gate contact GC2 may include first and second sub contacts CB and CA. Unlike the first gate contact GC1, in the second gate contact GC2, one sidewall of the second sub contact CA and one sidewall of the first sub contact CB may be aligned with each other. That is, the first sub contact CB may have a first sidewall SW1, and the second sub contact CA may have a second sidewall SW2 adjacent to the first sidewall SW1. The first and second sidewalls SW1 and SW2 may be coplanar with each other. When viewed in a plan view, the second sub contact CA may be disposed between the third and fourth gate structures G3 and G4. The second sub contact CA may be closer to the fourth gate structure G4 than the third gate structure G3.

Referring to FIG. 3B, when viewed in a cross-sectional view in the first direction D1, upper and lower portions of the second gate contact GC2 may have a fourth width W4 and a fifth width W5, respectively. An upper portion of the second gate contact GC2 may be the second sub contact CA. A lower portion of the second gate contact GC2 may be the vertical extending portion VP of the first sub contact CB. The fifth width W5 may be smaller than the fourth width W4. That is, when viewed in a cross-sectional view in the first direction D1, the second gate contact GC2 may have a T-shaped section. Although the second gate contact GC2 is only shown here, the first and third gate contacts GC1 and GC3 may also have a similar cross-sectional structure.

A second conductive line CBL2 may be disposed on the second gate contact GC2. A second via V2 may be disposed between the second gate contact GC2 and the second conductive line CBL2. In detail, the second via V2 may be provided on the second gate contact GC2. The second sub contact CA may serve as a pad for arrangement of the second via V2.

Referring back to FIGS. 2 and 3A, the third gate contact GC3 may include first and second sub contacts CB and CA. Unlike the first gate contact GC1, when viewed in a plan view, the first sub contact CB of the third gate contact GC3 may be extended in the second direction D2 to penetrate the second sub contact CA. That is, when viewed in a cross-sectional view in the second direction D2, the second sub contact CA may be surrounded by the first sub contact CB. When viewed in a plan view, the second sub contact CA may be positioned between the fifth and sixth gate structures G5 and G6. In detail, the second sub contact CA may be positioned to be closer to the fifth gate structure G5 than the sixth gate structure G6.

A third conductive line CBL3 may be disposed on the third gate contact GC3. A third via V3 may be disposed between the third gate contact GC3 and the third conductive line CBL3. In detail, the third via V3 may be provided on the third gate contact GC3. The second sub contact CA may serve as a pad for arrangement of the third via V3.

Figure 4:
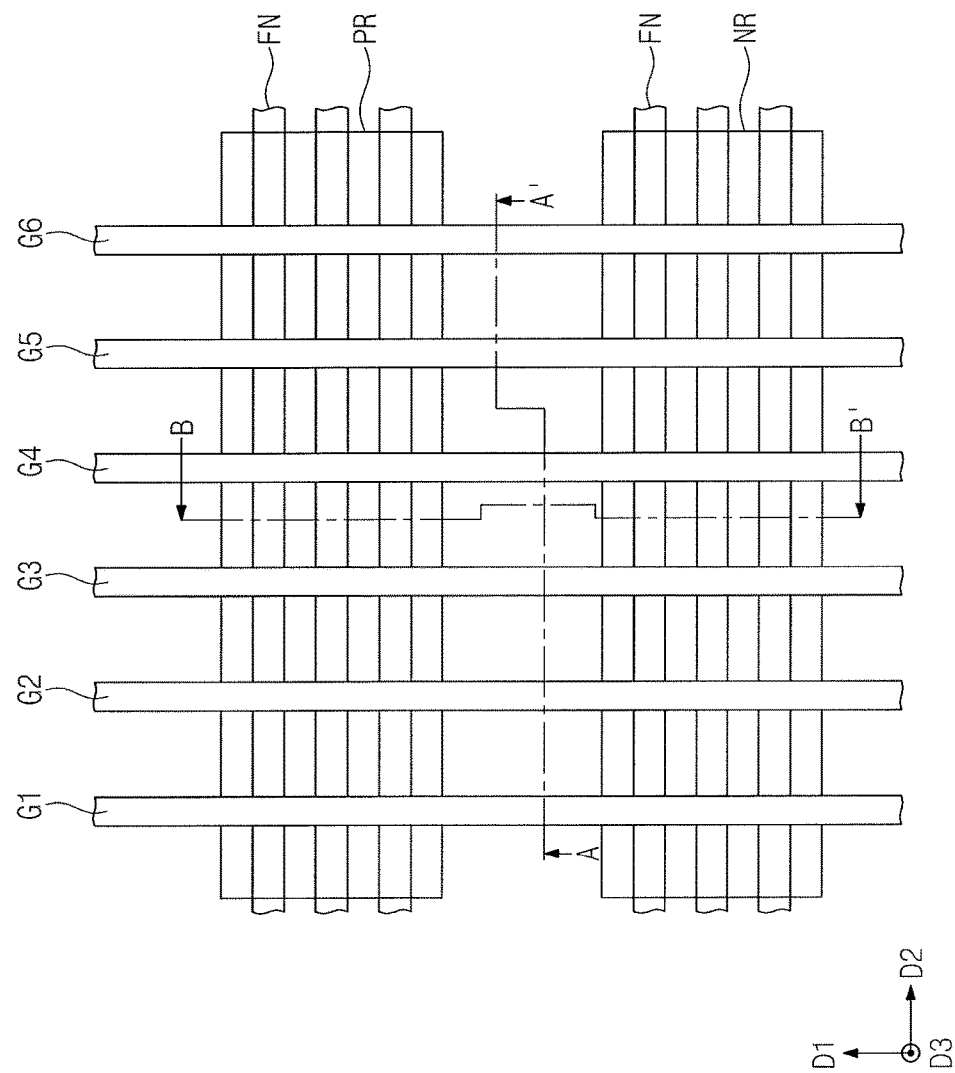
FIGS. 4, 6, and 8 illustrate plan views of a method of manufacturing a semiconductor device according to example embodiments.
Figure 5A:
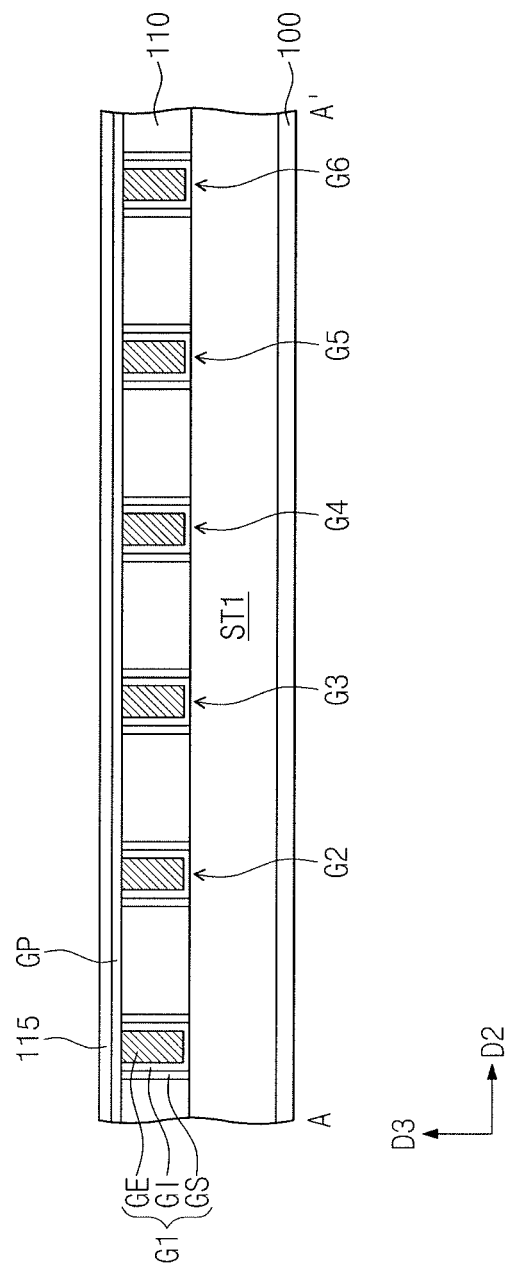
FIGS. 5A, 7A, and 9A illustrate cross-sectional views along line A-A' in FIGS. 4, 6, and 8, respectively.
Figure 5B:
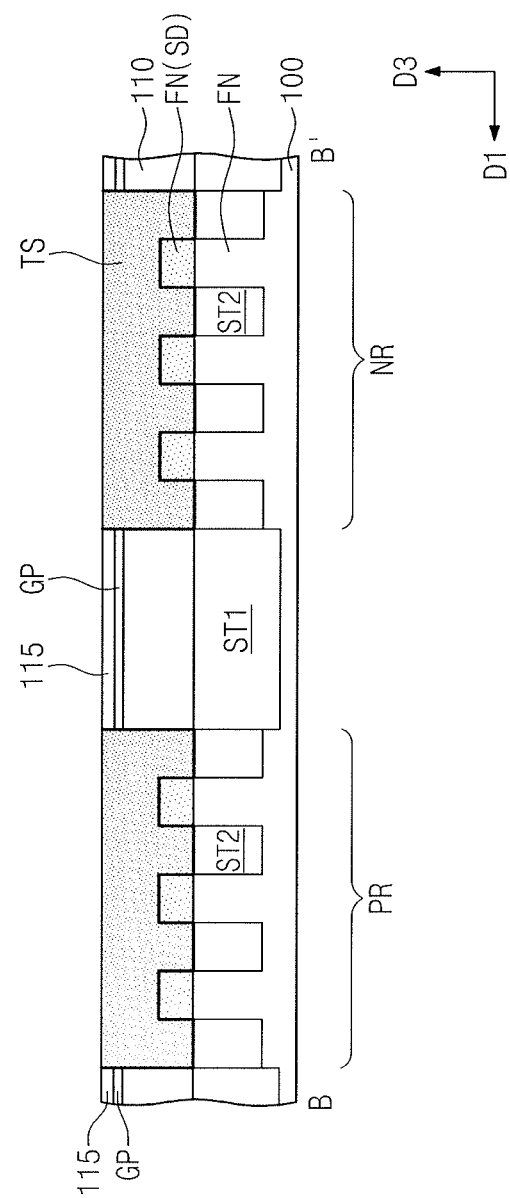
FIGS. 5B, 7B, and 9B illustrate cross-sectional views along line B-B' in FIGS. 4, 6, and 8, respectively.
Figure 6:
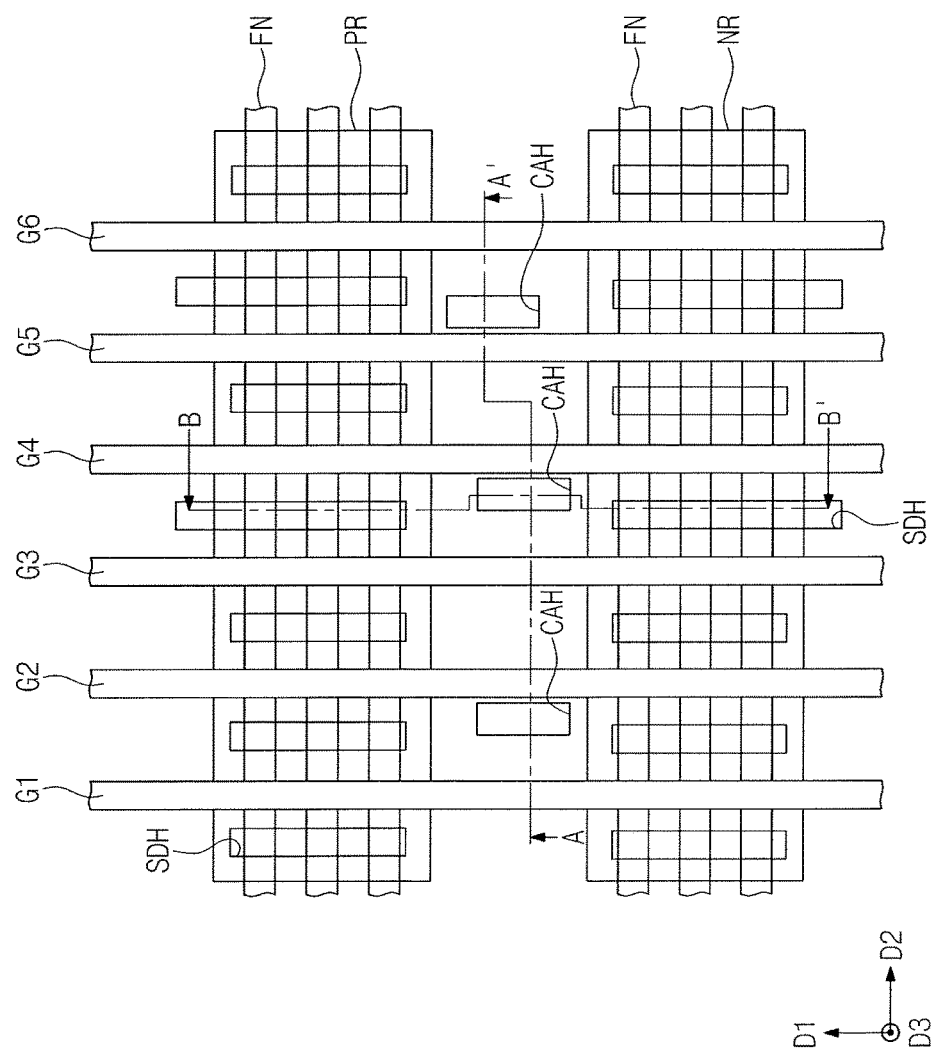
Figure 7A:
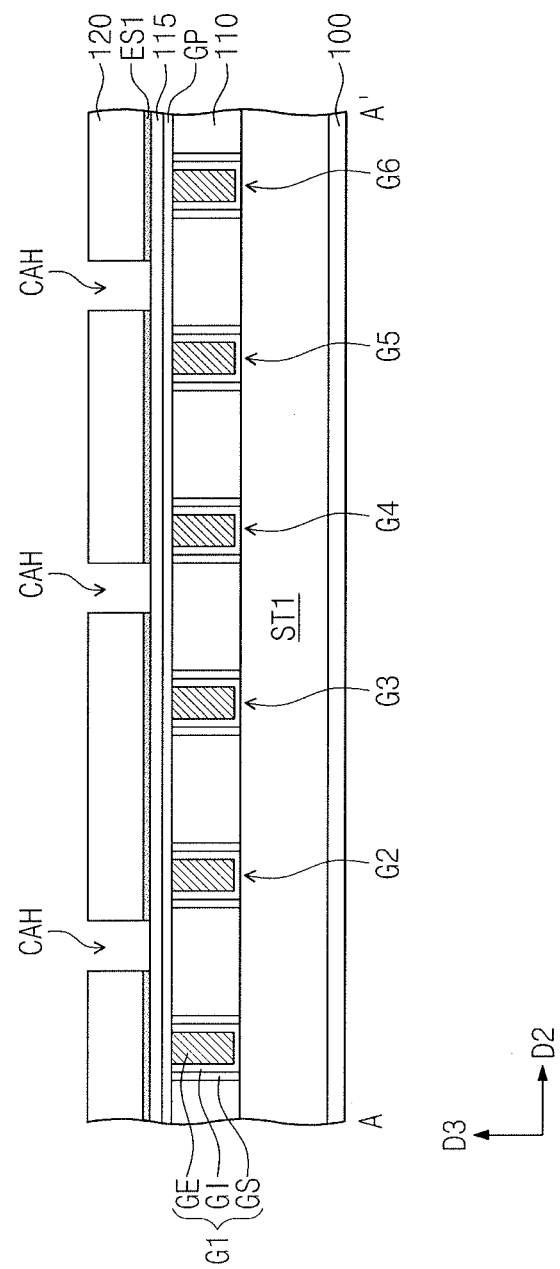
Figure 7B:
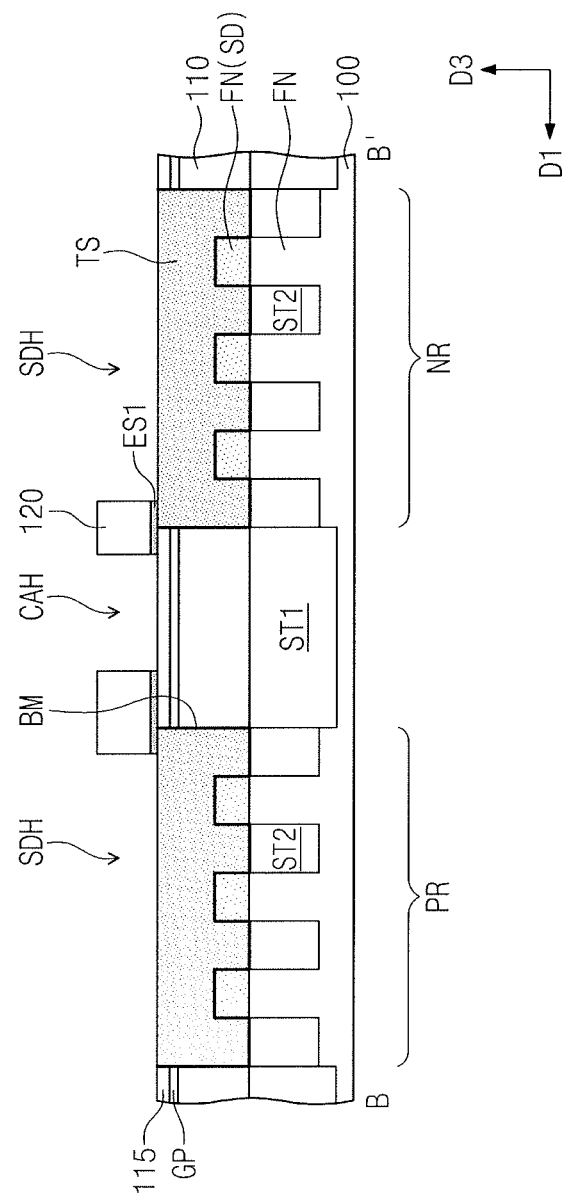
Figure 8:
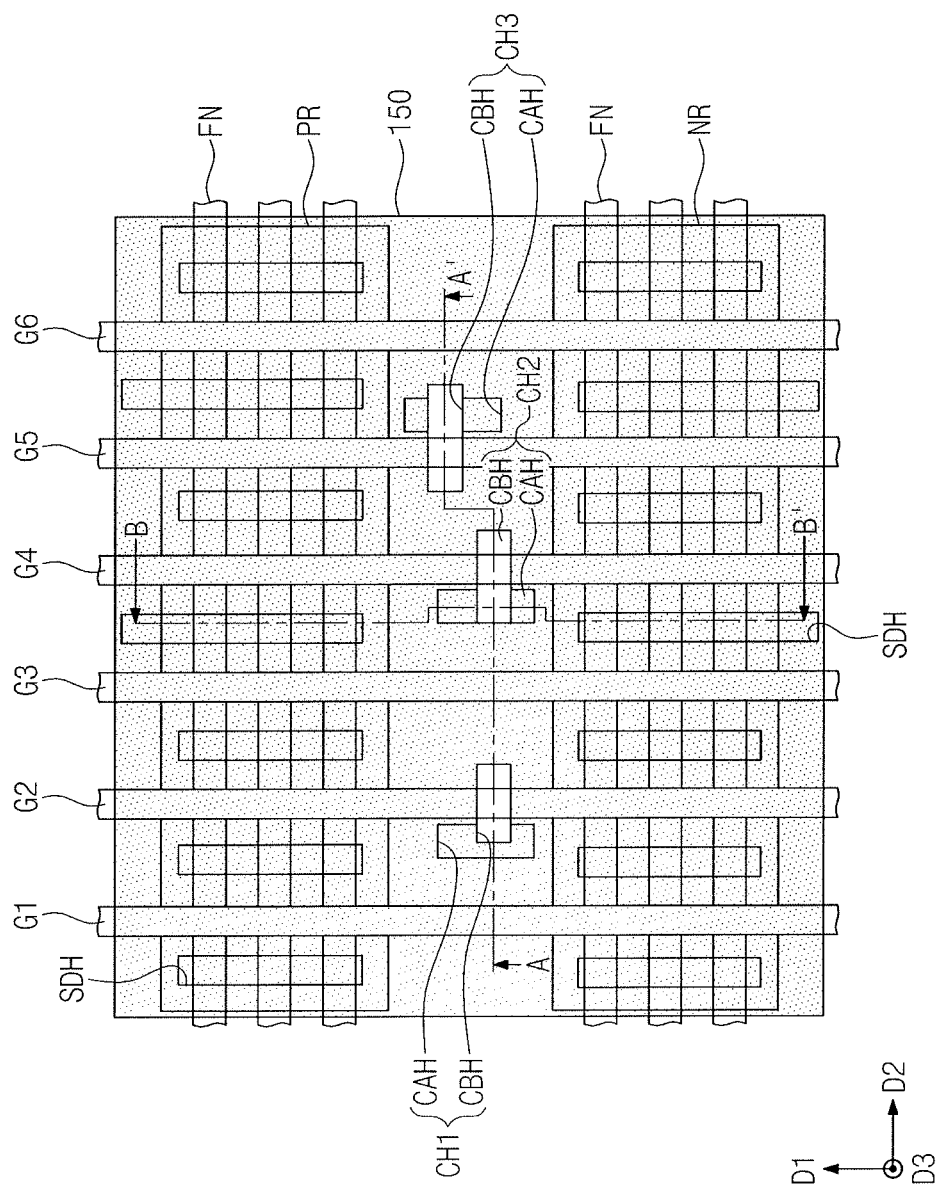
Figure 9A:
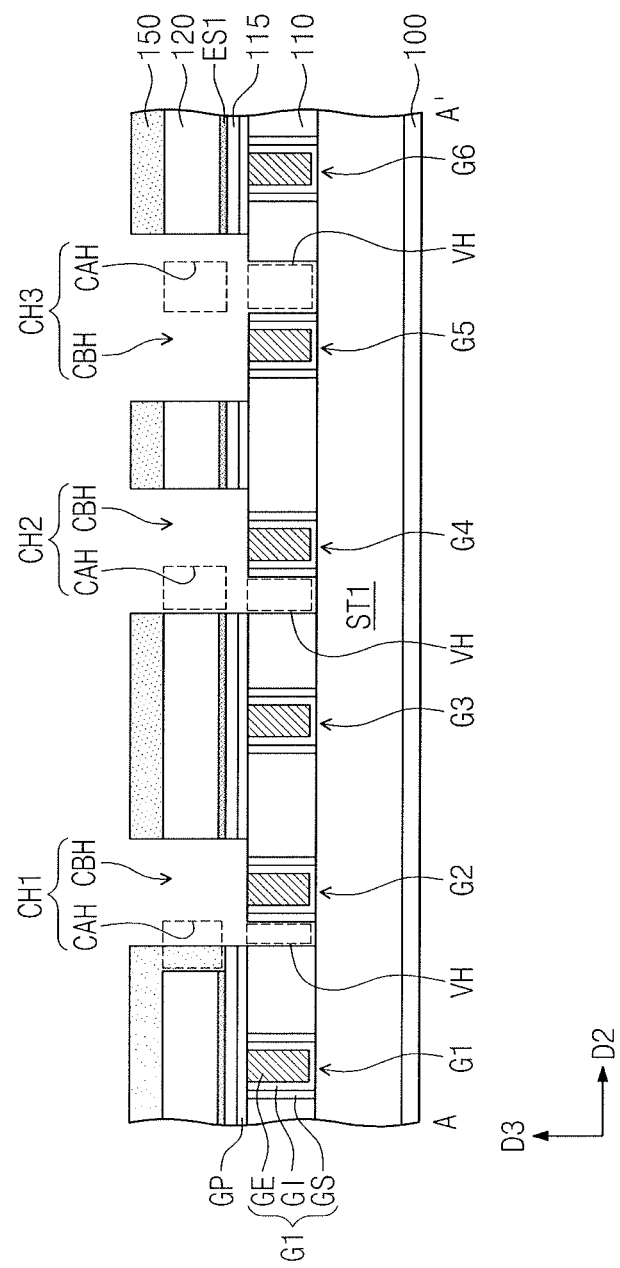
Figure 9B:
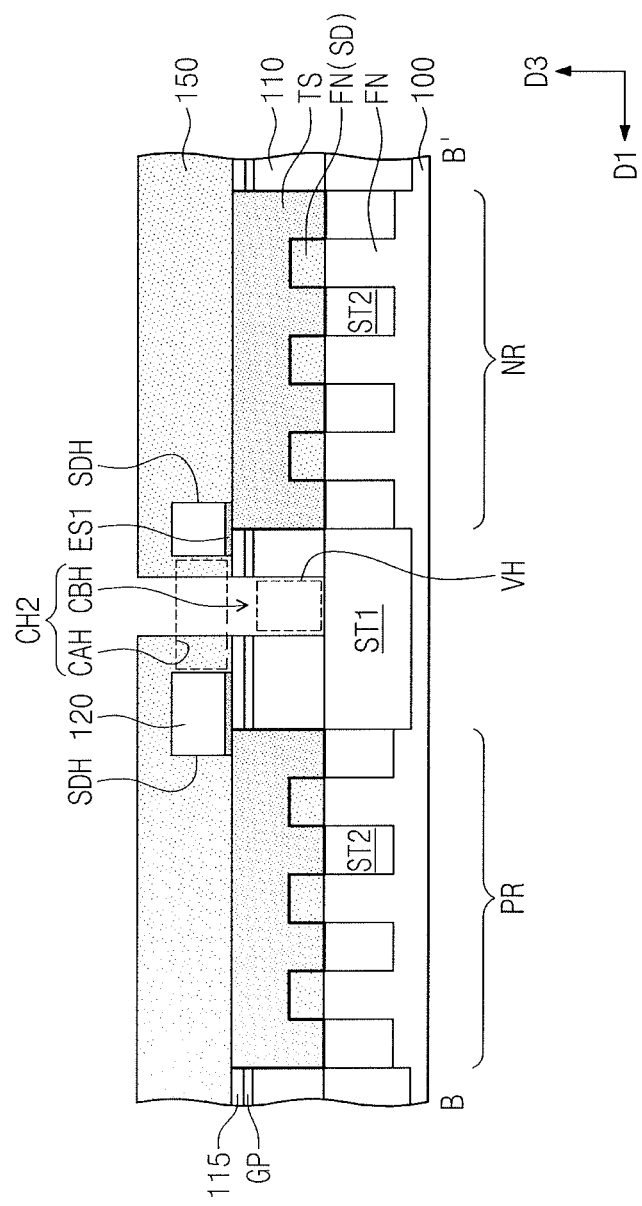

FIGS. 4, 6, and 8 are plan views illustrating a method of manufacturing a semiconductor device according to example embodiments. FIGS. 5A, 7A and 9A are cross-sectional views taken along the line A-A' of FIGS. 4, 6, and 8, respectively. FIGS. 5B, 7B, and 9B are cross-sectional views taken along the line B-B' of FIGS. 4, 6, and 8, respectively.

Referring to FIGS. 4, 5A and 5B, the first device isolation layer ST1 may be formed on the substrate 100 to define PMOSFET and NMOSFET regions PR and NR. The second device isolation layer ST2 may be formed to define the plurality of active patterns FN on each of the PMOSFET and NMOSFET regions PR and NR. Each of the second device isolation layers ST2 may be extended in the second direction D2. The substrate 100 may include, e.g., a silicon substrate, a germanium substrate, or a silicon-on-insulator (SOI) substrate. The first and second device isolation layers ST1 and ST2 may be formed by a shallow-trench isolation (STI) process, and may include, e.g., a silicon oxide layer.

The first and second device isolation layers ST1 and ST2 may have a depth in the direction opposite to the third direction D3. The third direction D3 may be perpendicular to the first and second direction D1 and D2 and a top surface of the substrate 100. As an example, the second device isolation layer ST2 may have a depth smaller than that of the first device isolation layer ST1. In this case, the second device isolation layer ST2 may be formed by a process separated from that for the first device isolation layer ST1. As another example, the second device isolation layer ST2 may be concurrently formed with the first device isolation layer ST1 and may have substantially the same depth as that of the first device isolation layer ST1.

The active patterns FN may include fin-shaped portions, which are provided between the second device isolation layers ST2 to have top surfaces protruding relative to those of the second device isolation layer ST2. The active patterns FN may be extended in the second direction D2.

The gate structures G1-G6 may be formed on the substrate 100 to cross the active patterns FN and extend in the first direction D1. The gate structures G1-G6 may be spaced apart from each other in the second direction D2. Forming the gate structures G1-G6 may include forming sacrificial gate patterns, forming gate spacers GS at both sides of the sacrificial gate patterns, and replacing the sacrificial gate patterns with gate insulating patterns GI and gate electrodes GE.

The gate insulating patterns GI may include at least one of, e.g., a silicon oxide layer, a silicon oxynitride layer, or a high-k dielectric layer with a dielectric constant that is higher than that of a silicon oxide layer. The gate electrodes GE may include at least one of, e.g., doped semiconductors, metals, or conductive metal nitrides. The gate spacers GS may include at least one of, e.g., a silicon oxide layer, a silicon nitride layer, or a silicon oxynitride layer.

An ion implantation process may be performed on the resulting structure provided with the gate structures G1-G6 to form source/drain regions SD on the active patterns FN. The source/drain regions SD may be formed in portions of the active patterns FN positioned at both sides of each of the gate structures G1-G6. The fin-shaped portions of the active patterns, which are positioned below the gate structures G1-G6 and are overlapped with the gate structures G1-G6, may not include the source/drain regions SD. The source/drain regions SD of the PMOSFET region may be formed by implanting a P-type impurity, and the source/drain regions SD of the NMOSFET region may be formed by implanting a N-type impurity.

The first interlayer insulating layer 110 may be formed on the substrate to cover the source/drain regions SD and fill gaps between the gate structures G1-G6. The capping layer GP may be formed on the first interlayer insulating layer 110 to cover top surfaces of the gate electrodes GE. The capping layer GP may include at least one of, e.g., a silicon oxide layer, a silicon nitride layer, or a silicon oxynitride layer. The second interlayer insulating layer 115 may be formed on the capping layer GP. The first and second interlayer insulating layers 110 and 115 may include at least one of, e.g., a silicon oxide layer or a silicon oxynitride layer.

Conductive connection patterns TS may be formed through the first and second interlayer insulating layers 110 and 115 and the capping layer GP, and may be connected to the source/drain regions SD. The formation of the conductive connection patterns TS may include forming recess regions to penetrate the first and second interlayer insulating layers 110 and 115 and the capping layer GP and to expose the source/drain regions SD at both sides of the gate structures G1-G6, forming a conductive material layer to fill the recess regions, and then, planarizing the conductive material layer until exposing the second interlayer insulating layer 115. Additionally, a barrier layer may be formed in the recess regions before filling them with the conductive material. The barrier layer may include titanium/titanium nitride (Ti/TiN).

The conductive connection patterns TS may include at least one of, e.g., metal silicide materials. As an example, the conductive connection patterns TS may include at least one of, e.g., titanium silicide, tantalum silicide, or tungsten silicide. The conductive connection patterns TS may further include a metal layer. The metal layer may include at least one of, e.g., titanium, tantalum, or tungsten. As an example, the conductive connection patterns TS may include, e.g., a metal-silicide layer and a metal layer on the metal-silicide layer.

In the PMOSFET regions PR, each of the conductive connection patterns TS may be formed to connect the source/drain regions SD, which are spaced apart from each other in the first direction D1 with the second device isolation layer ST2 therebetween, to each other. In the NMOSFET regions NR, the source/drain regions SD may be connected to each other by the conductive connection patterns TS in the same manner. That is, in the NMOSFET regions, each of the conductive connection patterns TS may be formed to connect the source/drain regions SD, which are spaced apart from each other in the first direction D1 with the second device isolation layers therebetween. The conductive connection patterns TS may be formed to have top surfaces positioned at higher level than those of the gate structures G1-G6.

Referring to FIGS. 6, 7A and 7B, the first etch stop layer ES1 and the third interlayer insulating layer 120 may be sequentially stacked on the resulting structure provided with the conductive connection patterns TS. The first etch stop layer ES1 may include, e.g., a silicon carbide nitride layer, and the third interlayer insulating layer 120 may include, e.g., a silicon oxide layer or silicon oxynitride layer. The first etch stop layer ES1 may prevent metal atoms in the conductive connection patterns TS from being diffused into a layer thereon.

Second sub contact holes CAH and source/drain contact holes SDH may be formed by concurrently patterning the first etch stop layer ES1 and the third interlayer insulating layer 120 using a first photo mask (not shown). That is, the second sub contact holes CAH and the source/drain contact holes SDH may be concurrently formed by a photolithography process. The patterning of the first etch stop layer ES1 and the third interlayer insulating layer 120 may be performed until top surfaces of the second interlayer insulating layer 115 and the conductive connection patterns TS are exposed.

In example embodiments, when viewed in a plan view, the second sub contact holes CAH may be formed between the first and second gate structures G1 and G2, between the third and fourth gate structures G3 and G4, and between the fifth and sixth gate structures G5 and G6, respectively. The source/drain contact holes SDH may expose the conductive connection patterns TS positioned at both sides of each of the gate structures G1-G6.

Furthermore, the second sub contact holes CAH may be formed on the first device isolation layer ST1 between the PMOSFET and NMOSFET regions PR and NR. When viewed in a plan view, the second sub contact holes CAH may be shaped like a bar. The source/drain contact holes SDH may be shaped like a bar extending in the first direction D1 along a top surface of the conductive connection pattern TS.

Referring to FIGS. 8, 9A and 9B, a mask layer 150 may be formed on the third interlayer insulating layer 120 to fill the second sub contact holes CAH and the source/drain contact holes SDH. The mask layer 150 may include, e.g., spin-on-hard mask (SOH) materials.

First sub contact holes CBH may be formed by patterning the mask layer 150 using a second photo mask (not shown). The second photo mask may be different from the first photo mask described previously. That is, the first sub contact holes CBH may be formed by a second photolithography process. The first to third interlayer insulating layer 110, 115 and 120, the capping layer GP and the first etch stop layer ES1 may be patterned together during a process of patterning the mask layer 150. The patterning of the mask layer 150 may be performed to expose top surfaces of the gate electrodes GE of the second, fourth, and fifth gate structures G2, G4 and G5 (FIG. 9A).

Further, the capping patterns GP of the second, fourth, and fifth gate structures G2, G4, and G5 may be removed during the patterning of the mask layer 150. The gate spacers GS of the second, fourth, and fifth gate structures G2, G4, and G5 may be partially etched by a process for forming vertical extending holes VH described later.

The first sub contact holes CBH may be formed on the first device isolation layer ST1 between the PMOSFET and NMOSFET regions PR and NR. Furthermore, the first sub contact holes CBH may be connected to the second sub contact holes CAH. That is, first, second and third connecting holes CH1, CH2 and CH3 may be formed on the second, fourth and fifth gate structures G2, G4 and G5, respectively.

Each of the first, second, and third connecting holes CH1, CH2 and CH3 may include the first and second sub contact holes CBH and CAH. The second sub contact hole CAH may include a vertical extending hole VH to expose one sidewall of the second gate structure G2. The vertical extending hole VH may expose some of the top surface of the first device isolation layer ST1.

In detail, the first sub contact hole CBH may be formed to be overlapped with a portion of the second sub contact hole CAH. As such, during formation of the first sub contact hole CBH, the second sub contact hole CAH may be etched further, e.g., double etching. In other words, a region of the first interlayer insulating layer 110 underneath an overlapped region of the first and second sub contact holes CBH and CAH may be over-etched along one sidewall of the second gate structure G2 to form the vertical extending hole VH. When viewed in a plan view, the vertical extending hole VH may be overlapped with the second sub contact hole CAH.

Referring back to FIGS. 2, 3A, and 3B, the mask layer 150 may be removed. The removal of the mask layer 150 may be performed using an ashing and/or strip process. Next, a barrier layer BM and a conductive layer may be formed on the third interlayer insulating layer 120 to fill the first to third connecting holes CH1, CH2 and CH3 and the source/drain contact holes SDH. The barrier layer BM may include, e.g., titanium/titanium nitride (Ti/TiN). The conductive layer may include, e.g., at least one of doped semiconductors, metals or conductive metal nitrides. The conductive layer and the barrier layer BM may be planarized to expose the third interlayer insulating layer 120, and thereby first to third gate contacts GC1, GC2 and GC3 and source/drain contacts SDC may be formed in the first to third connecting holes CH1, CH2 and CH3 and the source/drain contact holes SDH, respectively. Each of the first to third gate contacts GC1, GC2 and GC3 may include first and second sub contacts CB and CA, which are connected to constitute a single body. Each of the barrier layers BM may surround each of the first to third gate contacts GC1, GC2 and GC3. A portion of each of the barrier layers BM may be interposed between a respective one of the first to third gate contacts GC1, GC2 and GC3 and a respective one of the second, fourth and fifth gate structures G2, G4 and G5.

Next, a second etch stop layer ES2, a fourth interlayer insulating layer 130, a third etch stop layer ES,3 and a fifth interlayer insulating layer 140 may be sequentially formed on the third interlayer insulating layer 120 to cover the first to third gate contacts GC1, GC2, and GC3, and the source/drain contacts SDC. Vias V1-V5 may be formed to penetrate the fourth interlayer insulating layer 130. Conductive lines CBL1-CBL3 and wiring lines PW1 and PW2 may be formed in the fifth interlayer insulating layer 140.

The first to third vias V1-V3 may be formed on the first to third gate contacts GC1-GC3, respectively. Each of the first to third gate contacts GC1-GC3 may include the second sub contact CA formed together with the source/drain contacts SDC. The second sub contacts CA may prevent misalignments of the first to third vias V1-V3 because they serve to further enlarge areas of the first to third gate contacts GC1-GC3. Accordingly, it is possible to ensure a process margin for forming the first to third vias V1-V3. Furthermore, the first to third gate contacts GC1-GC3 and the first to third vias V1-V3 may have large contact areas therebetween due to large planar areas of the first to third gate contacts GC1-GC3. Accordingly, the semiconductor device having a low resistance and high reliability may be implemented.

Figure 10:
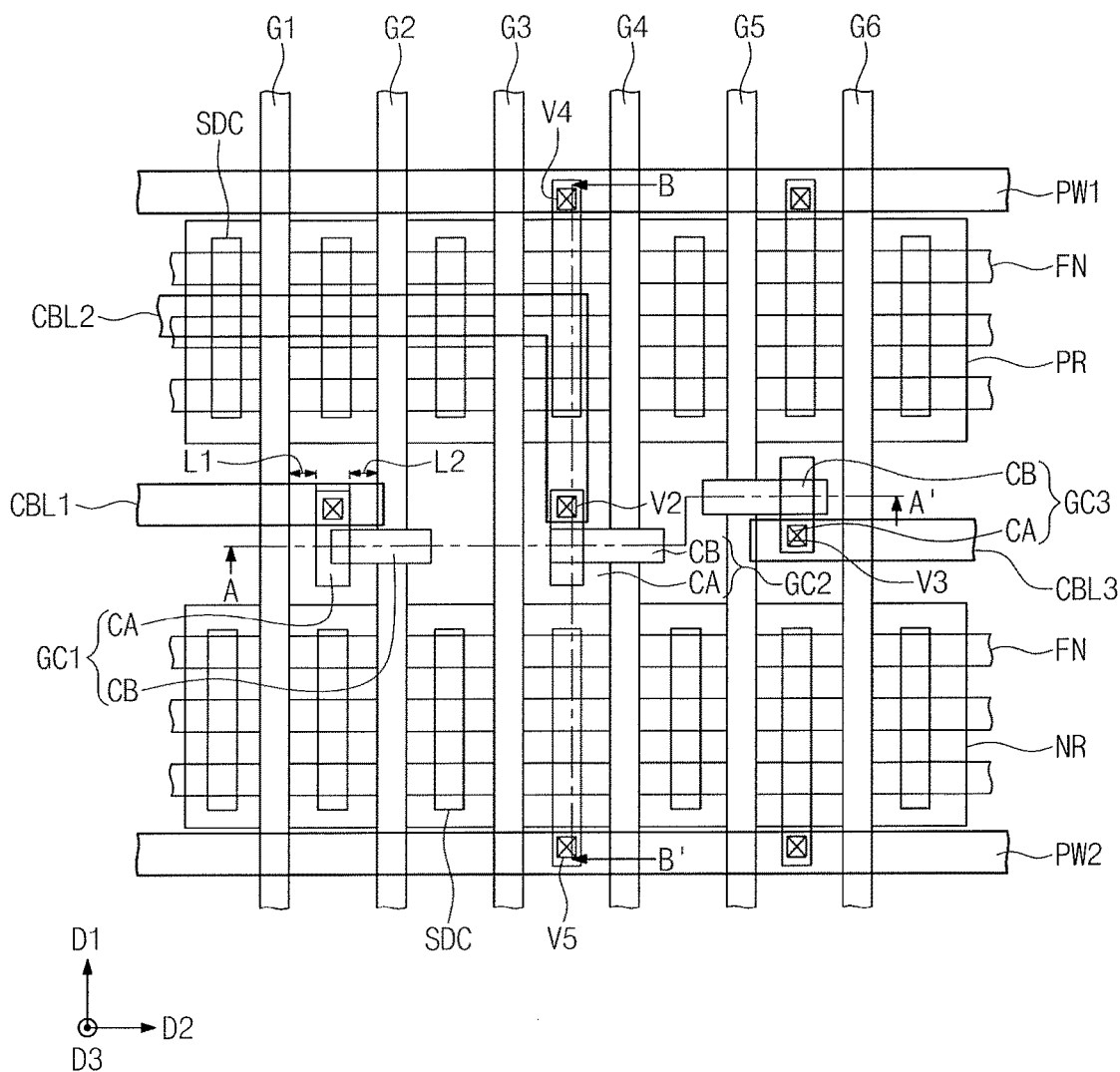
FIG. 10 illustrates a plan view of a semiconductor device according to other example embodiments.

FIG. 10 is a plan view illustrating a semiconductor device according to other example embodiments. In the following description, elements previously described with reference to FIGS. 2, 3A and 3B may be identified by similar or identical reference numbers without repeating and overlapping description thereof. FIGS. 3A and 3B may correspond to lines of A-A' and B-B' of FIG. 10

Referring to FIG. 10, when viewed in a plan view, the second sub contact CA of the first gate contact GC1 is disposed between the first and second gate structures G1 and G2. Unlike the description with reference to FIG. 2, the second sub contact CA may be disposed at a center region between both gate structures (e.g., G1 and G2). As an example, a distance between the first gate structure G1 and the second sub contact CA may be a first distance L1, a distance between the second gate structure G2 and the second sub contact CA may be a second distance L2. The first and second distances L1 and L2 may be substantially the same. The second sub contact CA of the second gate contacts GC2 may be also disposed at a center region between the third and fourth gate structures G3 and G4, and the second sub contact CA of the third gate contacts GC3 may be also disposed at a center region between the fifth and sixth gate structures G5 and G6.

Figure 11:
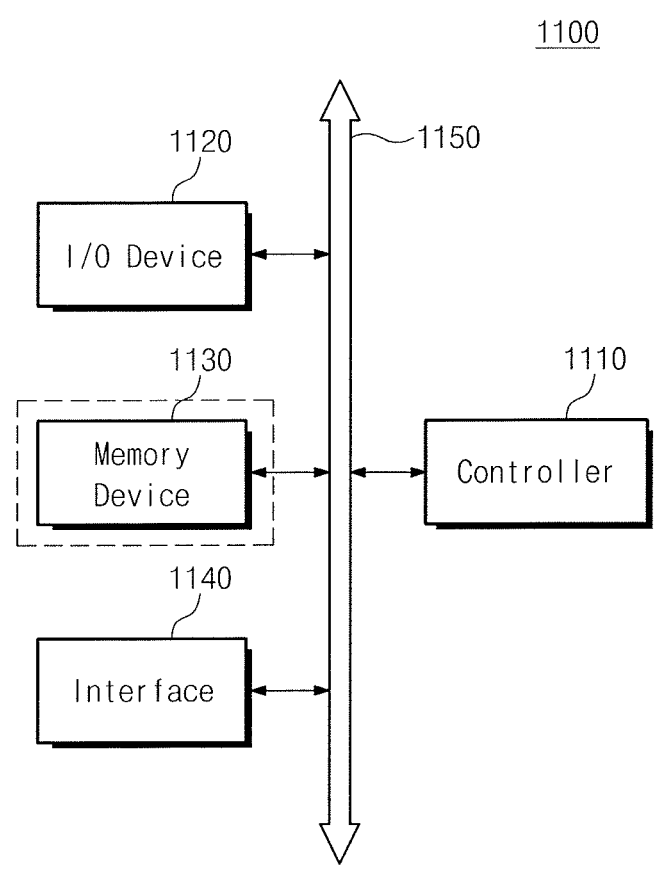
FIG. 11 illustrates a schematic block diagram of an example of electronic systems including a semiconductor device according to example embodiments.

FIG. 11 is a schematic block diagram illustrating an example of electronic systems including a semiconductor device according to example embodiments.

Referring to FIG. 11, an electronic system 1100 according to example embodiments may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other similar logic devices. The I/O unit 1120 may include a keypad, a keyboard, or a display unit. The memory device 1130 may store data and/or commands. The memory device 1130 may include a nonvolatile memory device, e.g., a flash memory device, a phase change memory device, and/or a magnetic memory device. In addition, the memory device 1130 may further include a volatile memory device. In this case, the memory device 1130 may include a SRAM (Static Random Access Memory) device including a semiconductor device according to example embodiments. The interface unit 1140 may transmit electrical data to a communication network or may receive electrical data from a communication network. The interface unit 1140 may operate in a wireless or wired manner. For example, the interface unit 1140 may include an antenna for the wireless communication or a transceiver for the wired and/or wireless communication. Although not shown in the drawings, the electronic system 1100 may further include a fast DRAM device and/or a fast SRAM device that acts as a cache memory for improving an operation of the controller 1110. The semiconductor device according to example embodiments may be provided as a part of the controller 1110 and/or the I/O unit 1120.

Figure 12:
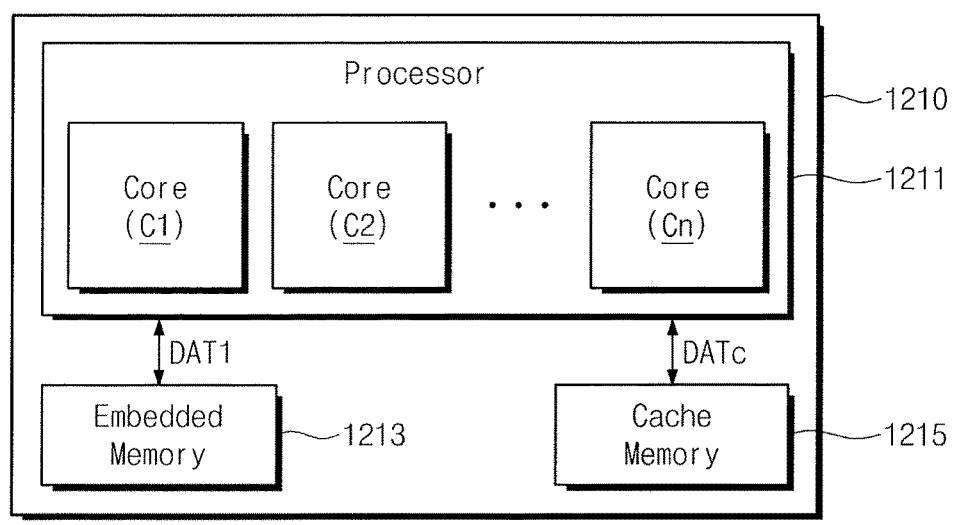
FIG. 12 illustrates a block diagram of an electronic device including a semiconductor device according to example embodiments.

FIG. 12 is a block diagram showing a configuration of an electronic device including a semiconductor device according to example embodiments.

Referring to FIG. 12, an electronic device 1200 may include a semiconductor chip 1210. The semiconductor chip 1210 may include a processor 1211, an embedded memory 1213, and a cache memory 1215.

The processor 1211 may include one or more processor cores C1-Cn. The one or more processor cores C1-Cn may process data and signals. The processor cores C1-Cn may include a semiconductor device in accordance with embodiments and, for example, a plurality of logic cells, e.g., in FIG. 1.

The electronic device 1200 may perform a specific function using the processing data and signals. The processor 1211 may be an application processor.

The embedded memory 1213 may exchange a first data DAT1 with the processor 1211. The first data DAT1 may be the data being processed or to be processed by the one or more processor cores C1-Cn. The embedded memory 1213 may manage the first data DAT1. For example, the embedded memory 1213 may buffer the first data DAT1. That is, the embedded memory 1213 may operate as a buffer memory or a working memory of the processor 1211.

According to an embodiment, the electronic device 1200 may be applied to a wearable device.

The embedded memory 1213 may be a SRAM (Static Random Access Memory). The SRAM may operate at a faster speed than a DRAM (Dynamic Random Access Memory). When the SRAM is embedded in the semiconductor chip 1210, the electronic device 1200 may have a small size and may operate at a high speed. The SRAM may include the semiconductor device according to embodiments.

The cache memory 1215 with the one or more processor cores C1 through Cn may be mounted on the semiconductor chip 1210. The cache memory 1215 may store a cache data DATc. The cache data DATc may be a data using the one or more processor cores C1 through Cn. The cache memory 1215 may include SRAM including the semiconductor device according to embodiments.

For ease of understanding, in FIG. 12, the cache memory 1215 is shown as a separate component. But the processor 1211 may be configured to include the cache memory 1215. FIG. 12 is not limited.

The processor 1211, the embedded memory 1213, and the cache memory 1215 may transmit data based on a variety of interface protocols. For example, the processor 1211, the embedded memory 1213, and the cache memory 1215 may transmit the data based on at least one of USB (Universal Serial Bus), SCSI (Small Computer System Interface), PCI (Peripheral Component Interconnect) Express, ATA (Advanced Technology Attachment), PATA (Parallel ATA), SATA (Serial ATA), SAS(Serial Attached SCSI), IDE (Integrated Drive Electronics), and UFS (Universal Flash Storage).

Figure 13:
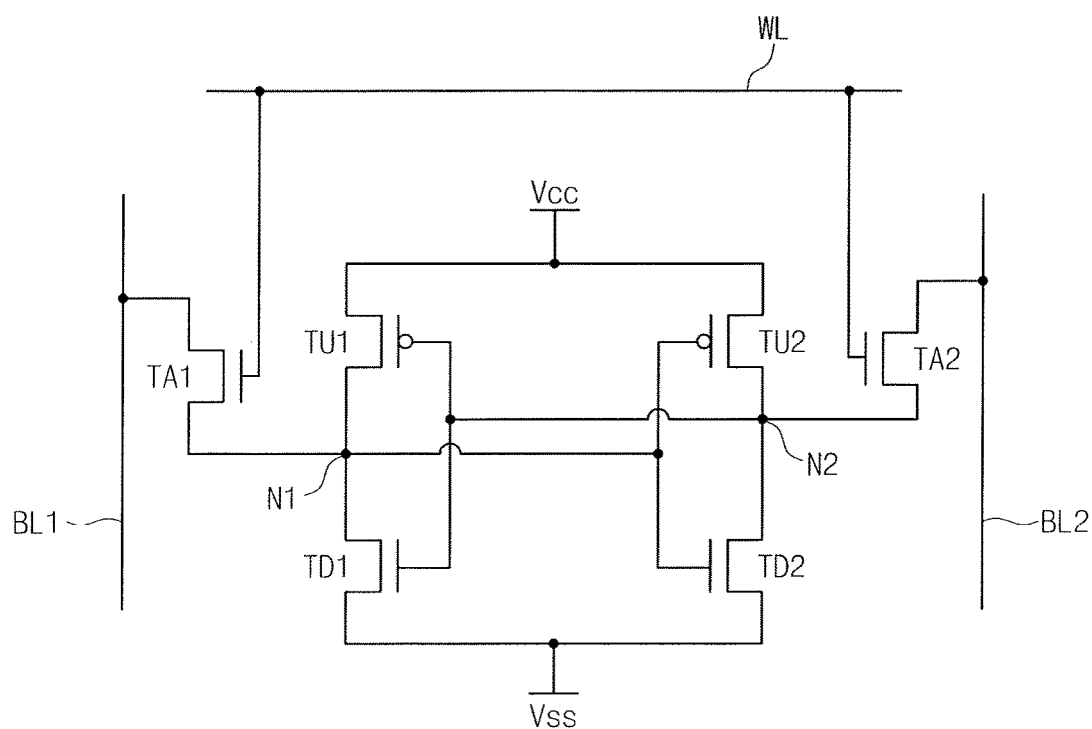
FIG. 13 illustrates a circuit diagram of a SRAM cell according to example embodiments.

FIG. 13 is a circuit diagram of a SRAM cell according to example embodiments. The SRAM cell may be applied to the embedded memory 1213 and/or to the cache memory 1215 illustrating in FIG. 12.

Referring to FIG. 13, the SRAM cell may include a first pull-up transistor TU1, a first pull-down transistor TD1, a second pull-up transistor TU2, a second pull-down transistor TD2, a first access transistor TA1 and a second access transistor TA2. The first and second pull-up transistors TU1 and TU2 may be PMOS transistors, and the first and second pull-down transistors TD1 and TD2 may be NMOS transistors.

A first source/drain of the first pull-up transistor TU1 and a first source/drain of the first pull-down transistor TD1 may be connected to a first node N1. A second source/drain of the first pull-up transistor TU1 may be connected to a power line Vcc and a second source/drain of the first pull-down transistor TD1 may be connected to a ground line Vss. A gate of the first pull-up transistor TU1 and a gate of the first pull-down transistor TD1 may be electrically connected to each other. Thus, the first pull-up transistor TU1 and the first pull-down transistor TD1 may constitute a first inverter. The gates of the first pull-up and pull down transistors TU1 and TD1 connected to each other may correspond to an input of the first inverter, and the first node may correspond to an output of the first inverter.

A first source/drain of the second pull-up transistor TU2 and a first source/drain of the second pull-down transistor TD2 may be connected to a second node N2. A second source/drain of the second pull-up transistor TU2 may be connected to a power line Vcc and a second source/drain of the second pull-down transistor TD2 may be connected to a ground line Vss. A gate of the second pull-up transistor TU2 and a gate of the second pull-down transistor TD2 may be electrically connected to each other. Thus, the second pull-up transistor TU2 and the second pull-down transistor TD2 may constitute a second inverter. The gates of the second pull-up and pull down transistors TU2 and TD2 connected to each other may correspond to an input of the second inverter, and the second node may correspond to an output of the second inverter.

The first and second inverters coupled to each other may constitute a latch structure. That is, the gates of the first pull-up and pull-down transistors TU1 and TD1 may be electrically connected to the second node N2, and the gates of the second pull-up and pull-down transistors TU2 and TD2 may be electrically connected to the first node N1. A first source/drain of the first access transistor TA1 may be connected to the first node N1, and a second source/drain of the first access transistor TA1 may be connected to a first bit line BL1. A first source/drain of the second access transistor TA2 may be connected to the second node N2, and a second source/drain of the second access transistor TA2 may be connected to a second bit line BL2. The gates of the first and second access transistors TA1 and TA2 may be connected to a word line WL. Thus, the SRAM cell in accordance with embodiments may be implemented.

Figure 14:
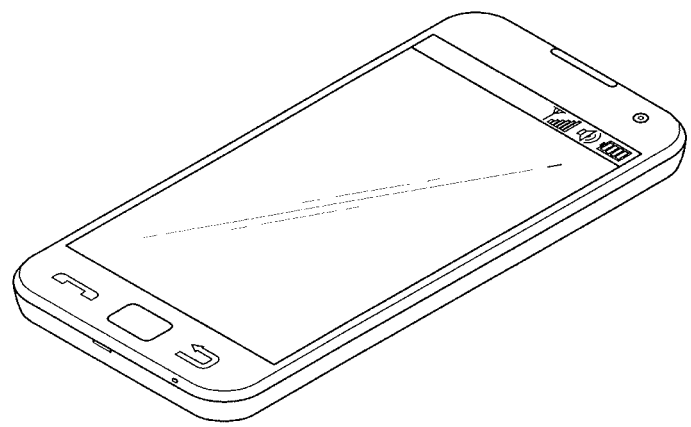
FIGS. 14 to 16 illustrate perspective views of multimedia devices including semiconductor devices according to embodiments.
Figure 15:
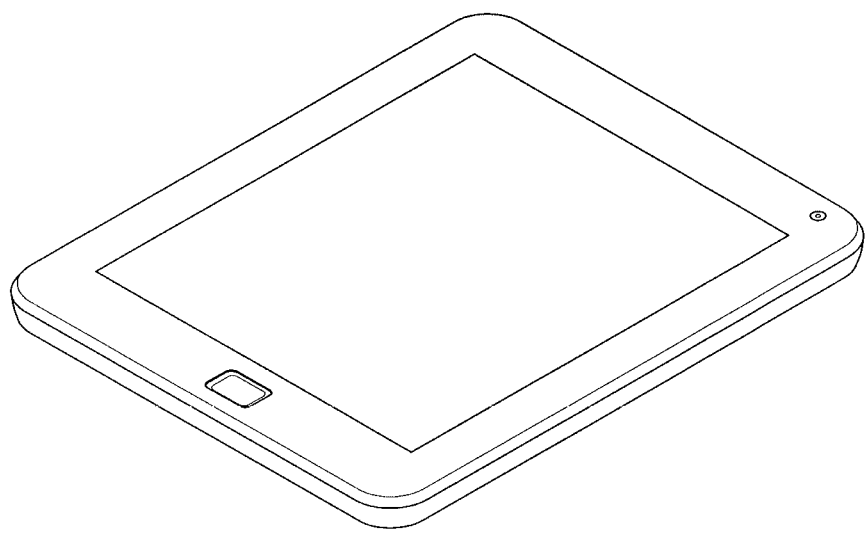
Figure 16:
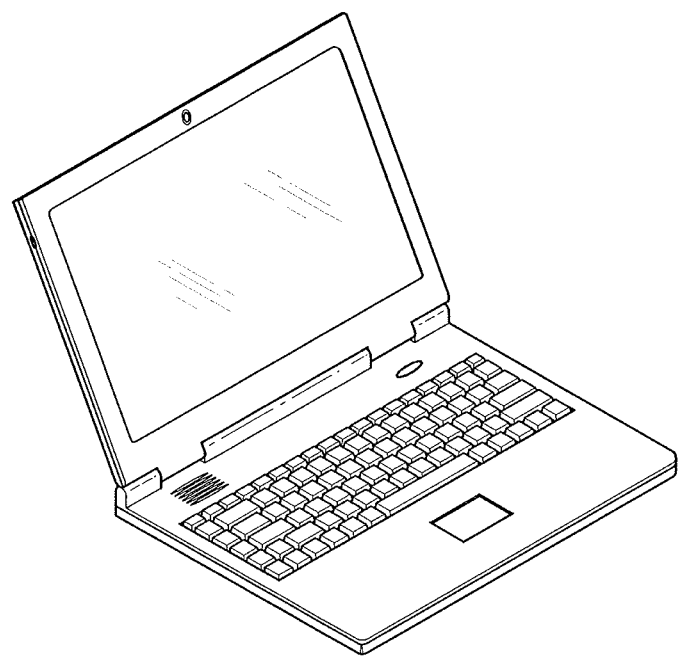

FIGS. 14 to 16 are perspective views illustrating multimedia devices including semiconductor devices according to embodiments. The electronic system 1100 of FIG. 11 and/or the electronic device 1200 of FIG. 12 may be applied to a mobile phone or a smart phone 2000 shown in FIG. 14, may be applied to a tablet or a smart tablet 3000 shown in FIG. 15, and may be applied to a notebook computer 4000 shown in FIG. 16.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a substrate including PMOSFET and NMOSFET regions;
a first gate structure extending in a first direction and crossing the PMOSFET and NMOSFET regions; and
a gate contact on and connected to the first gate structure, the gate contact being between the PMOSFET and NMOSFET regions,
wherein the gate contact includes:
a first sub contact in contact with a top surface of the first gate structure, the first sub contact including a vertical extending portion extending vertically toward the substrate along one sidewall of the first gate structure, and
a second sub contact spaced apart from the first gate structure, a top surface of the second sub contact being positioned at a same level as a top surface of the first sub contact.
2. The semiconductor device as claimed in claim 1, further comprising a device isolation layer between the PMOSFET and NMOSFET regions, the gate contact being on the first gate structure crossing the device isolation layer.
3. The semiconductor device as claimed in claim 2, wherein a bottom surface of the vertical extending portion is in contact with a top surface of the device isolation layer.
4. The semiconductor device as claimed in claim 1, wherein:
the substrate includes active patterns extending in a second direction perpendicular to the first direction on the PMOSFET and NMOSFET regions, and
the first gate structure crosses the active patterns.
5. The semiconductor device as claimed in claim 4, further comprising a second device isolation layer defining the active patterns in the substrate, upper portions of the active patterns protruding from the second device isolation layer.
6. The semiconductor device as claimed in claim 1, further comprising:
a via on the gate contact; and
a conductive line on the via and electrically connected to the first gate structure through the via and the gate contact.
7. The semiconductor device as claimed in claim 1, wherein the first and second sub contacts includes a same material and are connected to each other to constitute a single body.
8. The semiconductor device as claimed in claim 1, wherein, when viewed in a plan view, the vertical extending portion overlaps the second sub contact.
9. The semiconductor device as claimed in claim 1, further comprising a second gate structure adjacent to the first gate structure, the second sub contact being between the first and second gate structures when viewed in a plan view.
10. The semiconductor device as claimed in claim 9, further comprising a capping layer covering top surfaces of the first and second gate structures, a bottom surface of the vertical extending portion being at a lower level than that of the capping layer.
11. The semiconductor device as claimed in claim 1, further comprising:
source/drain regions at two sides of the first gate structure;
conductive connection patterns at the two sides of the first gate structure and connected to the source/drain regions; and
source/drain contacts on the conductive connection patterns and electrically connected the source/drain regions through the conductive connection patterns, wherein a bottom surface of the second sub contact is positioned at a substantially same level as a bottom surface of the source/drain contact.

12. The semiconductor device as claimed in claim 1, wherein, when viewed in a cross-sectional view in a second direction perpendicular to the first direction, the second sub contact protrudes from one sidewall of the first sub contact.

13. The semiconductor device as claimed in claim 1, wherein one sidewall of the gate contact has a stepped profile at a boundary at which the first and second sub contacts are in contact with each other.

14. The semiconductor device as claimed in claim 1, wherein;
the first sub contact has a first sidewall,
the second sub contact has a second sidewall adjacent to the first sidewall, the first sidewall of the first sub contact and the second sidewall of the sub contacts being coplanar with each other.

15. The semiconductor device as claimed in claim 1, wherein, when viewed in a plan view, the first sub contact extends in a second direction perpendicular to the first direction to penetrate the second sub contact.

16. The semiconductor device as claimed in claim 1, wherein the vertical extending portion of the first sub contact includes a void.

17. The semiconductor device as claimed in claim 1, further comprising a barrier layer surrounding a sidewall and a bottom surface of the gate contact, a portion of the barrier layer being between the first sub contact and the first gate structure.

18. A semiconductor device, comprising:
a substrate including PMOSFET and NMOSFET regions;
a device isolation layer between the PMOSFET and NMOSFET regions;
first and second gate electrodes crossing the device isolation layer and extending from the PMOSFET region to the NMOSFET region;
a gate contact on and connected to the first gate electrode on the device isolation layer, the gate contact including:
a first sub contact in contact with the first gate electrode, and
a second sub contact between the first and second gate electrodes, as viewed in a plan view;
a via on the gate contact; and
a conductive line on the via and electrically connected to the first gate electrode through the via and the gate contact.

19. The semiconductor device as claimed in claim 18, wherein the substrate includes active patterns on a respective one of the PMOSFET and NMOSFET regions, the first and second gate electrodes extending in parallel to each other and crossing the active patterns.

20. The semiconductor device as claimed in claim 18, wherein:
the first sub contact includes a vertical extending portion that extends vertically toward the substrate, the vertical extending portion being adjacent to one sidewall of the first gate electrode, and
when viewed in a plan view, the vertical extending portion overlaps the second sub contact.

21. A semiconductor device, comprising:
a substrate including PMOSFET and NMOSFET regions;
a first gate structure extending in a first direction and crossing the PMOSFET and NMOSFET regions; and
a gate contact on and connected to the first gate structure, the gate contact being between the PMOSFET and NMOSFET regions,
wherein the gate contact includes:
a first sub contact in contact with a top surface of the first gate structure, the first sub contact including a vertical extending portion extending vertically toward the substrate along one sidewall of the first gate structure, and
a second sub contact extending laterally from the first sub contact to have a non-overlapping relationship with the gate structure, a top surface of the second sub contact being level with a top surface of the first sub contact.

22. The semiconductor device as claimed in claim 21, wherein longitudinal directions of the first and second sub contacts are perpendicular to each other, the first and second sub contacts defining a single and seamless structure.

23. The semiconductor device as claimed in claim 22, wherein the vertical extending portion overlaps the second sub contact, the vertical extending portion extending from the second sub contact toward the substrate.

24. The semiconductor device as claimed in claim 21, further comprising source/drain regions at two sides of the first gate structure, top surfaces of the source/drain regions being level with the top surfaces of the first and second sub contacts.

25. The semiconductor device as claimed in claim 24, wherein a thickness of the second sub contact equals that of the source/drain regions.

* * * * *